United States Patent
Haba et al.

(10) Patent No.: US 9,437,579 B2
(45) Date of Patent: *Sep. 6, 2016

(54) MULTIPLE DIE FACE-DOWN STACKING FOR TWO OR MORE DIE

(71) Applicant: Tessera, Inc., San Jose, CA (US)

(72) Inventors: Belgacem Haba, Saratoga, CA (US); Wael Zohni, San Jose, CA (US); Richard Dewitt Crisp, Hornitos, CA (US); Ilyas Mohammed, Santa Clara, CA (US); Frank Lambrecht, Mountain View, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/689,346

(22) Filed: Apr. 17, 2015

(65) Prior Publication Data

US 2015/0221617 A1   Aug. 6, 2015

Related U.S. Application Data

(63) Continuation of application No. 13/741,890, filed on Jan. 15, 2013, now Pat. No. 9,013,033, which is a (Continued)

(51) Int. Cl.
*H01L 21/58* (2006.01)
*H01L 21/60* (2006.01)

(Continued)

(52) U.S. Cl.
CPC ........... *H01L 25/0657* (2013.01); *H01L 23/13* (2013.01); *H01L 23/492* (2013.01);

(Continued)

(58) Field of Classification Search
CPC .................. H01L 25/0657; H01L 2225/06562

USPC .................................................. 257/698, 724
See application file for complete search history.

(56) References Cited

U.S. PATENT DOCUMENTS 4,941,033 A   7/1990   Kishida
5,138,438 A   8/1992   Masayuki et al.

(Continued)

FOREIGN PATENT DOCUMENTS

CN   101055840 A   10/2007
JP   62107391      5/1987

(Continued)

OTHER PUBLICATIONS

Japanese Office Action for Application No. 2104-506416 dated Jun. 19, 2015.

(Continued)

*Primary Examiner* — George Fourson, III
(74) *Attorney, Agent, or Firm* — Lerner, David, Littenberg, Krumholz & Mentlik, LLP

(57) ABSTRACT

A microelectronic assembly can include a substrate having first and second surfaces each extending in first and second transverse directions, a peripheral edge extending in the second direction, first and second openings extending between the first and second surfaces, and a peripheral region of the second surface extending between the peripheral edge and one of the openings. The assembly can also include a first microelectronic element having a front surface facing the first surface, a rear surface opposite therefrom, and an edge extending between the front and rear surfaces. The assembly can also include a second microelectronic element having a front surface facing the rear surface of the first microelectronic element and projecting beyond the edge of the first microelectronic element. The assembly can also include a plurality of terminals exposed at the second surface, at least one of the terminals being disposed at least partially within the peripheral region.

15 Claims, 27 Drawing Sheets

Related U.S. Application Data continuation of application No. 13/565,613, filed on Aug. 2, 2012, now abandoned, which is a continuation-in-part of application No. 13/306,300, filed on Nov. 29, 2011, now Pat. No. 8,338,963.

(60) Provisional application No. 61/477,877, filed on Apr. 21, 2011.

(51) Int. Cl.

| | | |
|---|---|---|
| *H01L 25/065* | (2006.01) | |
| *H01L 23/492* | (2006.01) | |
| *H01L 23/13* | (2006.01) | |
| *H01L 23/31* | (2006.01) | |
| *H01L 23/00* | (2006.01) | |
| *H01L 23/498* | (2006.01) | |

(52) U.S. Cl.
CPC ......... *H01L23/49838* (2013.01); *H01L 24/09* (2013.01); *H01L 24/73* (2013.01); *H01L 25/0652* (2013.01); *H01L 23/3128* (2013.01); *H01L 23/49816* (2013.01); *H01L 24/06* (2013.01); *H01L 24/32* (2013.01); *H01L 24/48* (2013.01); *H01L 24/50* (2013.01); *H01L 2224/06155* (2013.01); *H01L 2224/06156* (2013.01); *H01L 2224/0912* (2013.01); *H01L 2224/32145* (2013.01); *H01L 2224/32225* (2013.01); *H01L 2224/32245* (2013.01); *H01L 2224/4824* (2013.01); *H01L 2224/4826* (2013.01); *H01L 2224/50* (2013.01); *H01L 2224/73215* (2013.01); *H01L 2224/73219* (2013.01); *H01L 2225/0651* (2013.01); *H01L 2225/06555* (2013.01); *H01L 2225/06562* (2013.01); *H01L 2225/06589* (2013.01); *H01L 2924/157* (2013.01); *H01L 2924/15311* (2013.01); *H01L 2924/181* (2013.01)

(56) References Cited

U.S. PATENT DOCUMENTS

| | | | |
|---|---|---|---|
| 5,148,265 A | 9/1992 | Khandros et al. | |
| 5,148,266 A | 9/1992 | Khandros et al. | |
| 5,222,014 A | 6/1993 | Lin | |
| 5,347,159 A | 9/1994 | Khandros et al. | |
| 5,480,840 A | 1/1996 | Barnes et al. | |
| 5,679,977 A | 10/1997 | Khandros et al. | |
| 5,777,391 A | 7/1998 | Nakamura et al. | |
| 5,804,874 A | 9/1998 | An et al. | |
| 5,861,666 A | 1/1999 | Bellaar | |
| 5,883,426 A | 3/1999 | Tokuno et al. | |
| 5,977,640 A | 11/1999 | Bertin et al. | |
| 5,998,864 A | 12/1999 | Khandros et al. | |
| 6,021,048 A | 2/2000 | Smith | |
| 6,072,233 A | 6/2000 | Corisis et al. | |
| 6,093,029 A | 7/2000 | Kwon et al. | |
| 6,150,724 A | 11/2000 | Wenzel et al. | |
| 6,169,325 B1 | 1/2001 | Azuma et al. | |
| 6,180,881 B1 | 1/2001 | Isaak | |
| 6,199,743 B1 | 3/2001 | Bettinger et al. | |
| 6,218,728 B1 | 4/2001 | Kimura | |
| 6,218,731 B1 | 4/2001 | Huang et al. | |
| 6,268,649 B1 | 7/2001 | Corisis et al. | |
| 6,335,565 B1 | 1/2002 | Miyamoto et al. | |
| 6,353,539 B1 | 3/2002 | Horine et al. | |
| 6,369,448 B1 | 4/2002 | McCormick | |
| 6,385,049 B1 | 5/2002 | Chia-Yu et al. | |
| 6,392,292 B1 | 5/2002 | Morishita | |
| 6,414,396 B1 | 7/2002 | Shim et al. | |
| 6,426,560 B1 | 7/2002 | Kawamura et al. | |
| 6,445,594 B1 | 9/2002 | Nakagawa et al. | |
| 6,472,741 B1 | 10/2002 | Chen et al. | |
| 6,492,726 B1 | 12/2002 | Quek et al. | |
| 6,583,502 B2 | 6/2003 | Lee et al. | |
| 6,703,713 B1 | 3/2004 | Tseng et al. | |
| 6,720,666 B2 | 4/2004 | Lim et al. | |
| 6,731,009 B1 | 5/2004 | Jones et al. | |
| 6,734,542 B2 | 5/2004 | Nakatani et al. | |
| 6,742,098 B1 | 5/2004 | Halbert et al. | |
| 6,762,942 B1 | 7/2004 | Smith | |
| 6,793,116 B2 | 9/2004 | Harada | |
| 6,811,580 B1 | 11/2004 | Littecke | |
| 6,818,474 B2 | 11/2004 | Kim et al. | |
| 6,977,440 B2 | 12/2005 | Pflughaupt et al. | |
| 7,061,105 B2 | 6/2006 | Masuda et al. | |
| 7,061,121 B2 | 6/2006 | Haba | |
| 7,095,104 B2 | 8/2006 | Blackshear | |
| 7,205,656 B2 | 4/2007 | Kim et al. | |
| 7,389,937 B2 | 6/2008 | Ito | |
| 7,462,936 B2 | 12/2008 | Haba et al. | |
| 7,504,284 B2 | 3/2009 | Ye et al. | |
| 7,633,146 B2 | 12/2009 | Masuda et al. | |
| 7,638,868 B2 | 12/2009 | Haba | |
| 7,855,462 B2 | 12/2010 | Boon et al. | |
| 7,880,310 B2 | 2/2011 | Mathew | |
| 7,892,889 B2 | 2/2011 | Howard et al. | |
| 7,969,006 B2 | 6/2011 | Lin et al. | |
| 8,026,589 B1 | 9/2011 | Kim et al. | |
| 8,254,155 B1 | 8/2012 | Crisp et al. | |
| 8,288,862 B2 | 10/2012 | Khiang et al. | |
| 8,304,881 B1 | 11/2012 | Haba et al. | |
| 8,338,963 B2 * | 12/2012 | Haba ................... | H01L 23/3128 257/777 |
| 8,378,478 B2 | 2/2013 | Desai et al. | |
| RE45,463 E | 4/2015 | Haba | |
| 9,013,033 B2 * | 4/2015 | Haba ................... | H01L 23/492 257/698 |
| 2001/0005311 A1 | 6/2001 | Duesman et al. | |
| 2002/0030267 A1 | 3/2002 | Suzuki | |
| 2002/0053727 A1 | 5/2002 | Kimura | |
| 2002/0175421 A1 | 11/2002 | Kimura | |
| 2003/0064547 A1 | 4/2003 | Akram et al. | |
| 2003/0116349 A1 | 6/2003 | Hashimoto | |
| 2003/0179549 A1 | 9/2003 | Zhong et al. | |
| 2003/0183917 A1 | 10/2003 | Tsai et al. | |
| 2003/0193788 A1 | 10/2003 | Farnworth et al. | |
| 2003/0224553 A1 | 12/2003 | Manansala | |
| 2004/0016939 A1 | 1/2004 | Akiba et al. | |
| 2004/0016999 A1 | 1/2004 | Misumi | |
| 2004/0124520 A1 | 7/2004 | Rinne | |
| 2004/0184240 A1 | 9/2004 | Su | |
| 2004/0262774 A1 | 12/2004 | Kang et al. | |
| 2005/0110125 A1 | 5/2005 | Blackshear | |
| 2005/0110162 A1 | 5/2005 | Meyer-Berg et al. | |
| 2005/0116326 A1 | 6/2005 | Haba et al. | |
| 2005/0116358 A1 | 6/2005 | Haba | |
| 2005/0133932 A1 | 6/2005 | Pohl et al. | |
| 2005/0164486 A1 | 7/2005 | Lua et al. | |
| 2005/0173807 A1 | 8/2005 | Zhu et al. | |
| 2005/0218514 A1 | 10/2005 | Massingill | |
| 2005/0258538 A1 | 11/2005 | Gerber | |
| 2006/0006405 A1 | 1/2006 | Mazzochette | |
| 2006/0027902 A1 | 2/2006 | Ararao et al. | |
| 2006/0081583 A1 | 4/2006 | Hembree et al. | |
| 2006/0097379 A1 | 5/2006 | Wang | |
| 2006/0097400 A1 | 5/2006 | Cruz et al. | |
| 2006/0113653 A1 | 6/2006 | Xiaoqi et al. | |
| 2006/0145323 A1 | 7/2006 | Lee | |
| 2006/0197210 A1 | 9/2006 | Kim | |
| 2006/0231938 A1 | 10/2006 | Mangrum | |
| 2006/0249827 A1 | 11/2006 | Fasano et al. | |
| 2006/0290005 A1 | 12/2006 | Thomas et al. | |
| 2007/0066139 A1 | 3/2007 | Roeper et al. | |
| 2007/0075409 A1 | 4/2007 | Letterman et al. | |
| 2007/0108592 A1 | 5/2007 | Lai et al. | |
| 2007/0120238 A1 | 5/2007 | Vaiyapuri | |
| 2007/0152310 A1 | 7/2007 | Osborn et al. | |
| 2007/0160817 A1 | 7/2007 | Roh | |
| 2007/0164407 A1 | 7/2007 | Jun et al. | |
| 2007/0176297 A1 | 8/2007 | Zohni | |
| 2007/0176298 A1 | 8/2007 | Osone et al. | |

(56) References Cited

U.S. PATENT DOCUMENTS

| | | |
|---|---|---|
| 2007/0181989 A1 | 8/2007 | Corisis et al. |
| 2007/0218689 A1 | 9/2007 | Ha et al. |
| 2007/0235886 A1 | 10/2007 | Yilmaz et al. |
| 2007/0257376 A1 | 11/2007 | Shimokawa et al. |
| 2008/0001241 A1 | 1/2008 | Tuckerman et al. |
| 2008/0001309 A1 | 1/2008 | Tago |
| 2008/0023805 A1 | 1/2008 | Howard et al. |
| 2008/0036067 A1 | 2/2008 | Lin |
| 2008/0042249 A1 | 2/2008 | Haba |
| 2008/0048777 A1 | 2/2008 | Kohjiro et al. |
| 2008/0073777 A1 | 3/2008 | Cui et al. |
| 2008/0093725 A1 | 4/2008 | Jung et al. |
| 2008/0116557 A1 | 5/2008 | Paek et al. |
| 2008/0122067 A1 | 5/2008 | Wang |
| 2008/0136006 A1 | 6/2008 | Jang et al. |
| 2008/0237844 A1 | 10/2008 | Aleksov et al. |
| 2008/0237887 A1 | 10/2008 | Takiar et al. |
| 2008/0237891 A1 | 10/2008 | Irsigler et al. |
| 2008/0246130 A1 | 10/2008 | Carney et al. |
| 2008/0296717 A1 | 12/2008 | Beroz et al. |
| 2008/0303153 A1 | 12/2008 | Oi et al. |
| 2008/0315377 A1 | 12/2008 | Eichelberger et al. |
| 2009/0017583 A1 | 1/2009 | Jun et al. |
| 2009/0045524 A1 | 2/2009 | Mohammed et al. |
| 2009/0051043 A1 | 2/2009 | Wong et al. |
| 2009/0057864 A1 | 3/2009 | Choi et al. |
| 2009/0068858 A1 | 3/2009 | Di Stefano |
| 2009/0079061 A1 | 3/2009 | Mallik et al. |
| 2009/0104734 A1 | 4/2009 | Specht et al. |
| 2009/0108422 A1 | 4/2009 | Sasaki et al. |
| 2009/0166839 A1 | 7/2009 | Suzuki et al. |
| 2009/0168366 A1 | 7/2009 | Clayton et al. |
| 2009/0179321 A1 | 7/2009 | Sakamoto et al. |
| 2009/0185317 A1 | 7/2009 | Dijkhuis et al. |
| 2009/0200652 A1 | 8/2009 | Oh et al. |
| 2009/0200680 A1 | 8/2009 | Shinohara et al. |
| 2009/0236700 A1 | 9/2009 | Moriya |
| 2009/0243064 A1 | 10/2009 | Camacho et al. |
| 2009/0256266 A1 | 10/2009 | Lao et al. |
| 2009/0267222 A1 | 10/2009 | Zhong et al. |
| 2010/0019377 A1 | 1/2010 | Arvelo et al. |
| 2010/0044861 A1 | 2/2010 | Chiu et al. |
| 2010/0065955 A1 | 3/2010 | Chye et al. |
| 2010/0072602 A1 | 3/2010 | Sutardja |
| 2010/0090326 A1 | 4/2010 | Baek et al. |
| 2010/0127044 A1 | 5/2010 | Ota et al. |
| 2010/0127362 A1 | 5/2010 | Fan et al. |
| 2010/0133665 A1 | 6/2010 | Ha et al. |
| 2010/0193930 A1 | 8/2010 | Lee |
| 2010/0230795 A1 | 9/2010 | Kriman et al. |
| 2010/0244278 A1 | 9/2010 | Shen |
| 2010/0258928 A1 | 10/2010 | Chi et al. |
| 2010/0295166 A1 | 11/2010 | Kim |
| 2010/0314740 A1 | 12/2010 | Choi et al. |
| 2010/0321885 A1 | 12/2010 | Huang |
| 2010/0327419 A1 | 12/2010 | Muthukumar et al. |
| 2011/0079905 A1 | 4/2011 | Sanchez et al. |
| 2011/0085304 A1 | 4/2011 | Bindrup et al. |
| 2011/0193582 A1 | 8/2011 | Cho |
| 2012/0091574 A1 | 4/2012 | Lin et al. |
| 2012/0092832 A1 | 4/2012 | Haba et al. |
| 2012/0126389 A1 | 5/2012 | Desai et al. |
| 2012/0153435 A1 | 6/2012 | Haba et al. |
| 2012/0155049 A1 | 6/2012 | Haba et al. |
| 2012/0267796 A1 | 10/2012 | Haba et al. |
| 2012/0267798 A1 | 10/2012 | Haba et al. |
| 2013/0015586 A1 | 1/2013 | Crisp et al. |
| 2013/0082394 A1 | 4/2013 | Crisp et al. |
| 2013/0099387 A1 | 4/2013 | Caskey et al. |
| 2013/0168843 A1 | 7/2013 | Zohni |
| 2013/0249116 A1 | 9/2013 | Mohammed et al. |
| 2014/0035121 A1 | 2/2014 | Haba et al. |

FOREIGN PATENT DOCUMENTS

| | | |
|---|---|---|
| JP | H08-227908 A | 9/1996 |
| JP | H11-145323 A | 5/1999 |
| JP | H11345932 A | 12/1999 |
| JP | 2000243875 A | 9/2000 |
| JP | 2001085609 A | 3/2001 |
| JP | 2001118876 A | 4/2001 |
| JP | 2001196407 A | 7/2001 |
| JP | 2001223324 A | 8/2001 |
| JP | 2002-076252 A | 3/2002 |
| JP | 2003-101207 | 4/2003 |
| JP | 2004-063767 A | 2/2004 |
| JP | 2005045251 A | 2/2005 |
| JP | 2005166892 A | 6/2005 |
| JP | 2005243975 A | 9/2005 |
| JP | 2005251957 A | 9/2005 |
| JP | 2006079629 A | 3/2006 |
| JP | 2006093189 A | 4/2006 |
| JP | 2006514438 A | 4/2006 |
| JP | 2006-210892 | 8/2006 |
| JP | 2006303079 A | 11/2006 |
| JP | 2007123595 A | 5/2007 |
| JP | 2007134426 A | 5/2007 |
| JP | 2008177241 A | 7/2008 |
| JP | 2008-198841 A | 8/2008 |
| JP | 2008187146 A | 8/2008 |
| JP | 2008-235576 | 10/2008 |
| JP | 2010501118 A | 1/2010 |
| JP | 2010-098098 A | 4/2010 |
| JP | 2010206083 A | 9/2010 |
| JP | 2013546197 A | 12/2013 |
| KR | 2001-0002214 A | 1/2001 |
| KR | 20010081922 A | 8/2001 |
| KR | 2001-0094894 A | 11/2001 |
| KR | 10-0382035 B1 | 5/2003 |
| KR | 10-0393095 B1 | 7/2003 |
| KR | 2005-0119414 A | 12/2005 |
| KR | 2006-0120365 A | 11/2006 |
| KR | 10-0690247 B1 | 2/2007 |
| KR | 1020060004298 | 3/2007 |
| KR | 2007-0088177 A | 8/2007 |
| KR | 2009-0008341 A | 1/2009 |
| KR | 2009-0086314 A | 8/2009 |
| KR | 2010-0041430 A | 4/2010 |
| KR | 101011863 B1 | 1/2011 |
| KR | 101061531 B1 | 9/2011 |
| TW | I301314 B | 9/2008 |
| TW | I313049 B | 8/2009 |
| TW | 201239998 | 10/2012 |
| WO | 9812568 | 3/1998 |
| WO | 2004080134 A2 | 9/2004 |
| WO | 2007088757 A1 | 8/2007 |
| WO | 2011001789 A1 | 1/2011 |

OTHER PUBLICATIONS

Japanese Office Action for Application No. 2014-506417 dated Aug. 4, 2015.
Non-Final Rejection mailed Nov. 19, 2012 in U.S. Appl. No. 12/907,522.
Amendment Filed Mar. 19, 2013 in Response to Non-Final Rejection mailed Nov. 19, 2012 in U.S. Appl. No. 12/907,522.
Final Rejection mailed May 8, 2013 in U.S. Appl. No. 12/907,522.
Amendment Filed May 24, 2013 in Response to Final Rejection mailed May 8, 2013 in U.S. Appl. No. 12/907,522.
Non-Final Rejection mailed Jan. 9, 2014 in U.S. Appl. No. 14/406,233.
Amendment Filed Apr. 9, 2014 in Response to Non-Final Rejection mailed Jan. 9, 2014 in U.S. Appl. No. 14/046,233.
Final Rejection mailed Jun. 20, 2014 in U.S. Appl. No. 14/046,233.
Amendment Filed Aug. 19, 2014 in Response to Final Rejection mailed Jun. 20, 2014 in U.S. Appl. No. 14/046,233.
Japanese Office Action for Application No. 2014-506417 dated Apr. 14, 2015.
Taiwanese Office Action for Application No. 101112511 dated Sep. 30, 2014.

(56) References Cited

OTHER PUBLICATIONS

Taiwanese Office Action for Application No. 102138051 dated Apr. 7, 2015.
Asinash Roy et al: "Effects of Coupling Capacitance and Inductance on Delay Uncertainty and Clock Skew", 2007 44th ACM/IEEE Design Automation Conference, San Diego, CA, Jun. 4-8, 2007, IEEE, PI Scataway, NJ, Jun. 1, 2007, pp. 184-187, XP031183328.
European Examination Report for Application No. 11776969.5 dated Jun. 27, 2014.
International Preliminary Report on Patentability for Application No. PCT/US2011/056352 dated Apr. 23, 2013.
International Search Report and Written Opinion for application No. PCT/US2012/029873 dated Jun. 4, 2012.
International Search Report and Written Opinion for Application No. PCT/US2012/029876 dated Aug. 17, 2012.
International Search Report and Written Opinion for Application No. PCT/US2012/032997 dated Aug. 7, 2012.
International Search Report and Written Opinion for Application No. PCT/US2012/071630 dated Apr. 4, 2013.
International Search Report and Written Opinion for Application No. PCT/US2013/053240 dated Sep. 16, 2013.
International Search Report and Written Opinion for Application No. PCT/US2013/065605 dated Feb. 21, 2014.
International Search Report and Written Opinion for PCT/US2012/034196 dated Jun. 4, 2012.
International Search Report Application No. PCT/US2011/031391, dated Dec. 12, 2011.
International Search Report for Application No. PCT/US2011/056352 dated Apr. 5, 2012.
Korean Application No. 10-2011-0041843, dated May, 3, 2011 (English translation of Spec and drawings).
Korean Search Report from U.S. Appl. No. 61/477,820, dated Sep. 6, 2011.
Korean Search Report from U.S. Appl. No. 61/477,877, dated Sep. 6, 2011.
Korean Search Report from U.S. Appl. No. 61/477,883, dated Sep. 6, 2011.
Korean Search Report from U.S. Appl. No. 61/477,967, dated Sep. 6, 2011.
Office Action from Korean Patent Application No. 10-2010-0129888 dated Jan. 18, 2011.
Office Action from Korean Patent Application No. 10-2010-0129890 dated Jan. 18, 2011.
Partial International Search Report Application No. PCT/US2011/031391, dated Aug. 25, 2011.
Partial International Search Report for Application No. PCT/US2012/032997 dated Jun. 27, 2012.
Partial Search Report for Application No. PCT/US2013/065605 dated Nov. 28, 2013.
Search Report from Korean Patent Application No. 10-2010-0129888 dated Jan. 18, 2011.
Search Report from Korean Patent Application No. 10-2010-0129890 dated Jan. 18, 2011.
Second Written Opinion for Application No. PCT/US2013/053240 dated Jul. 29, 2014.
Taiwanese Office Action for Application No. 101112514 dated Mar. 13, 2014.
U.S. Appl. No. 61/477,877, filed Apr. 21, 2011.
Written Opinion of the International Preliminary Examining Authority dated Apr. 16, 2013 for Application No. PCT/US2012/029876.

\* cited by examiner

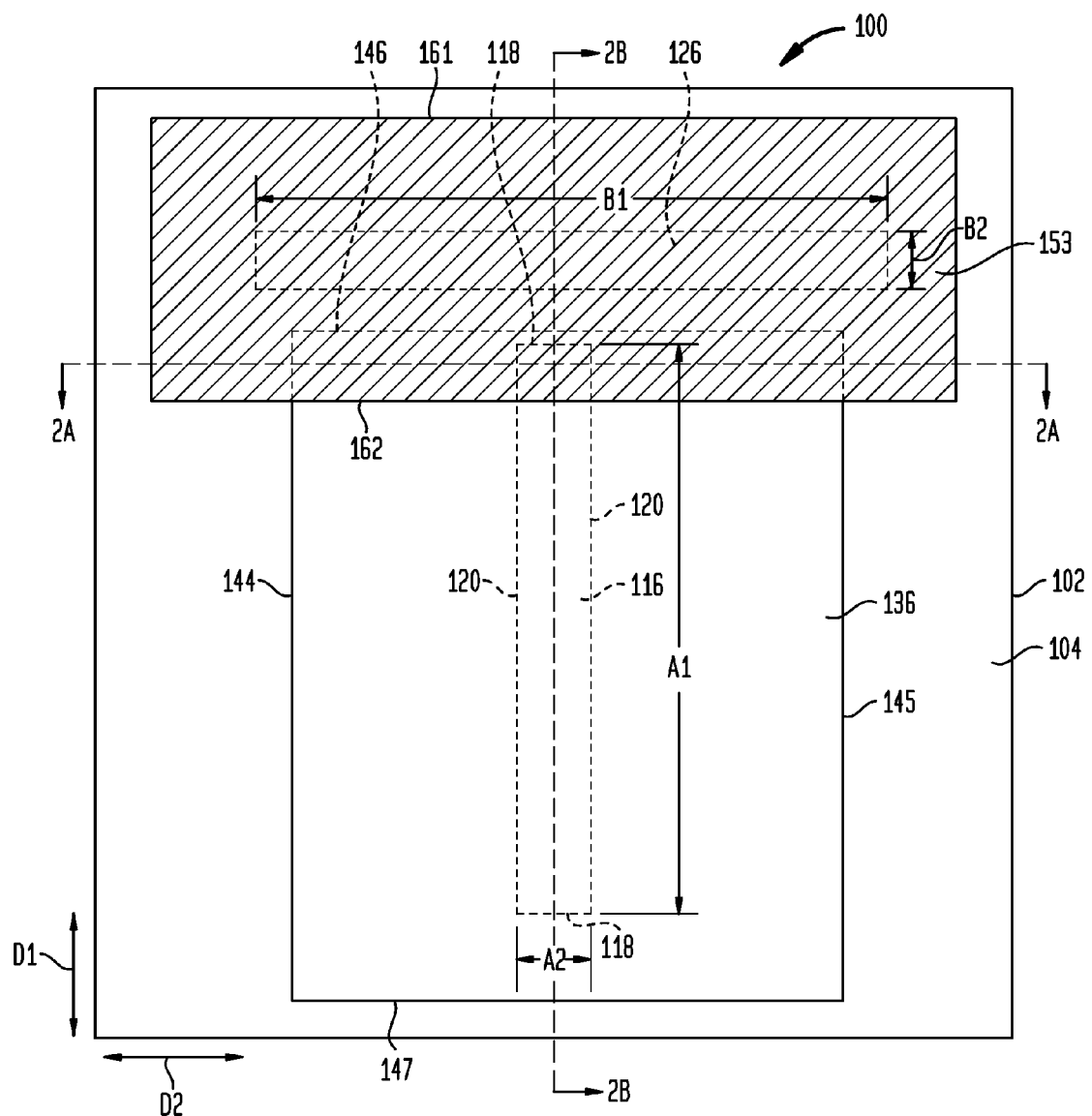

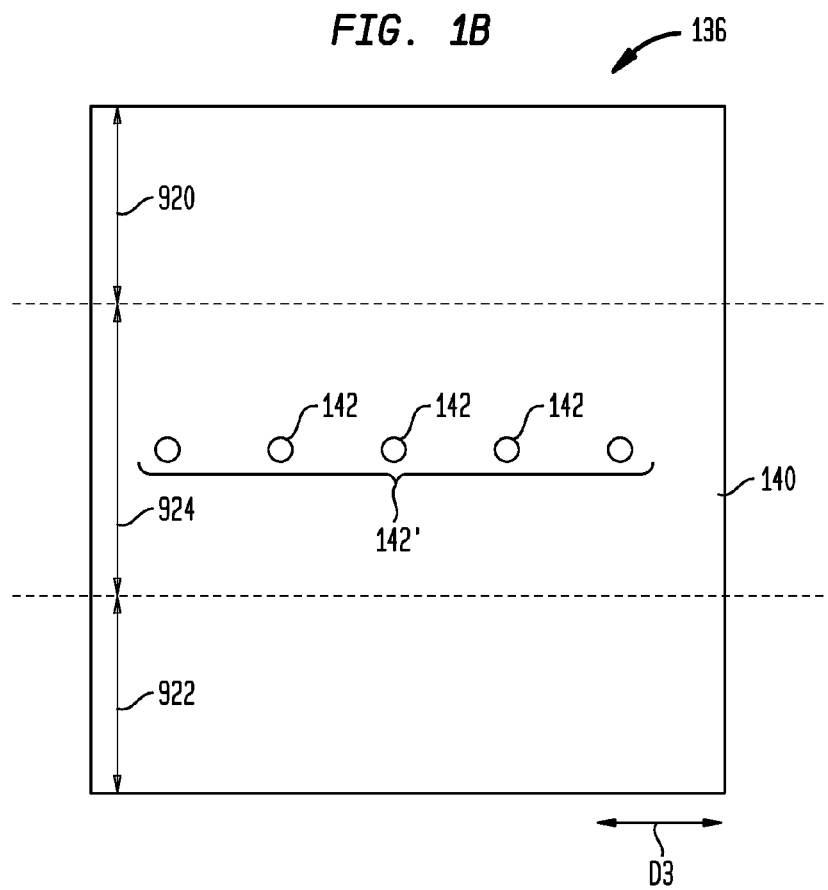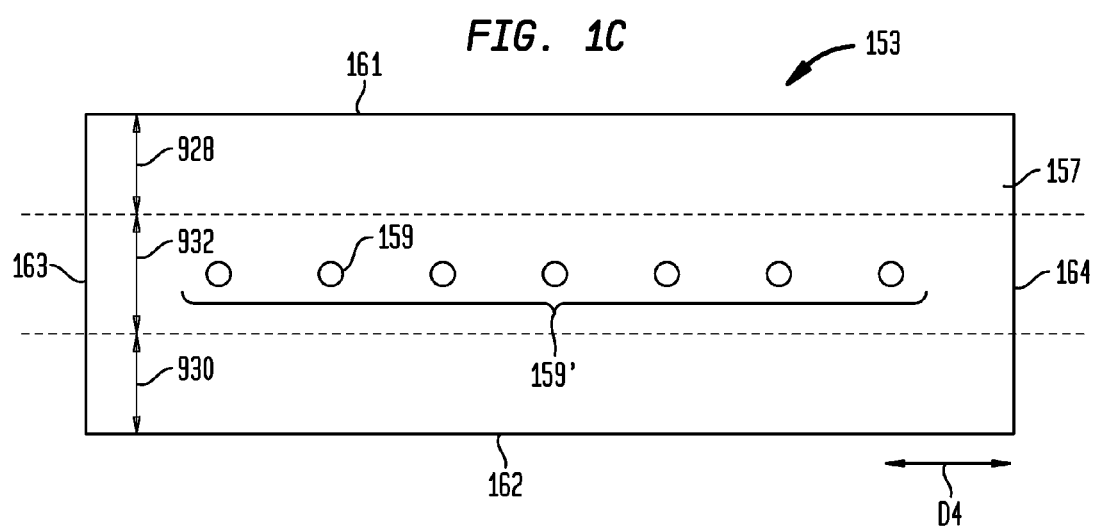

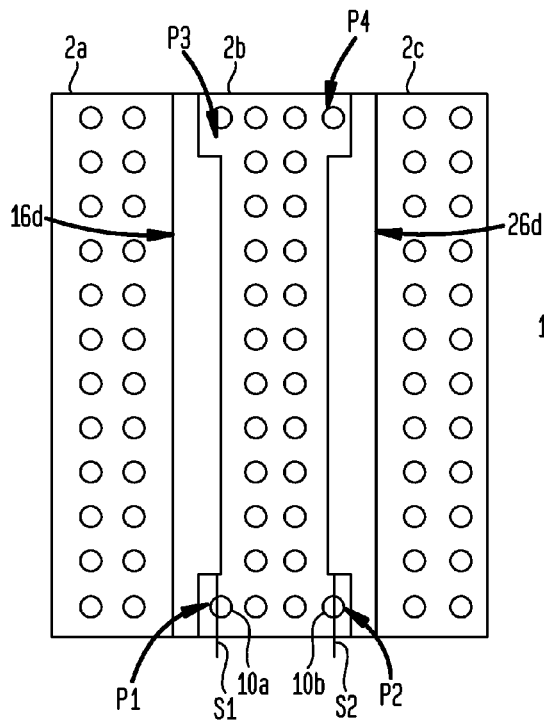
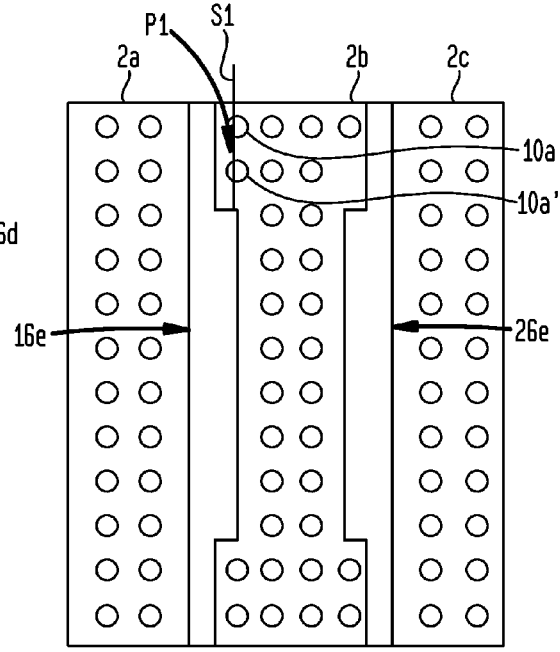
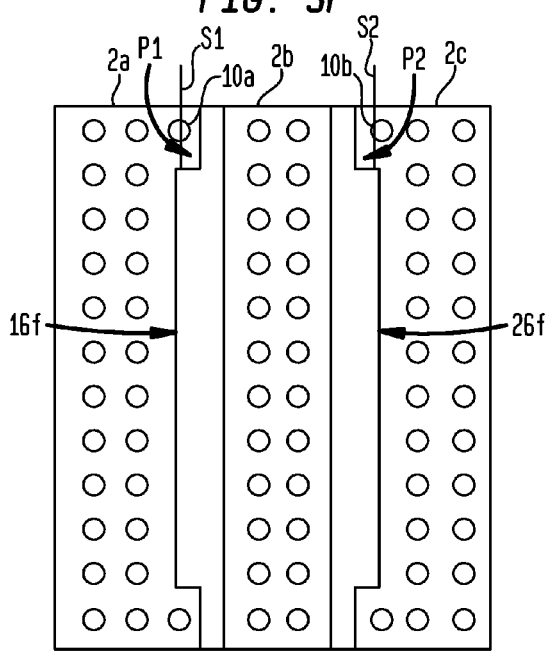
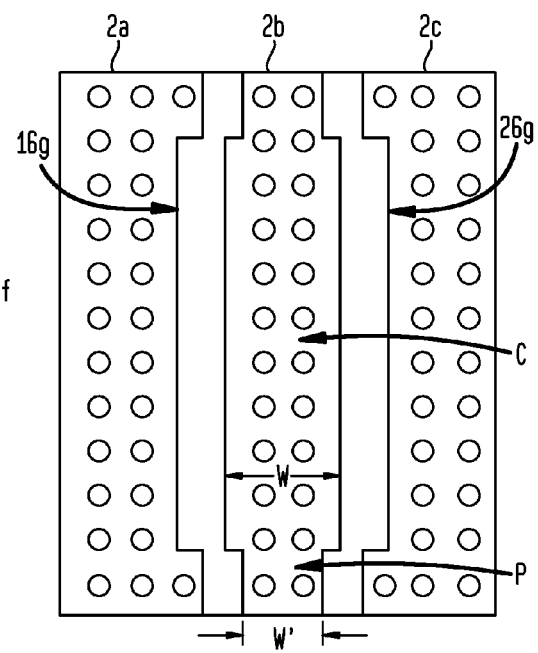

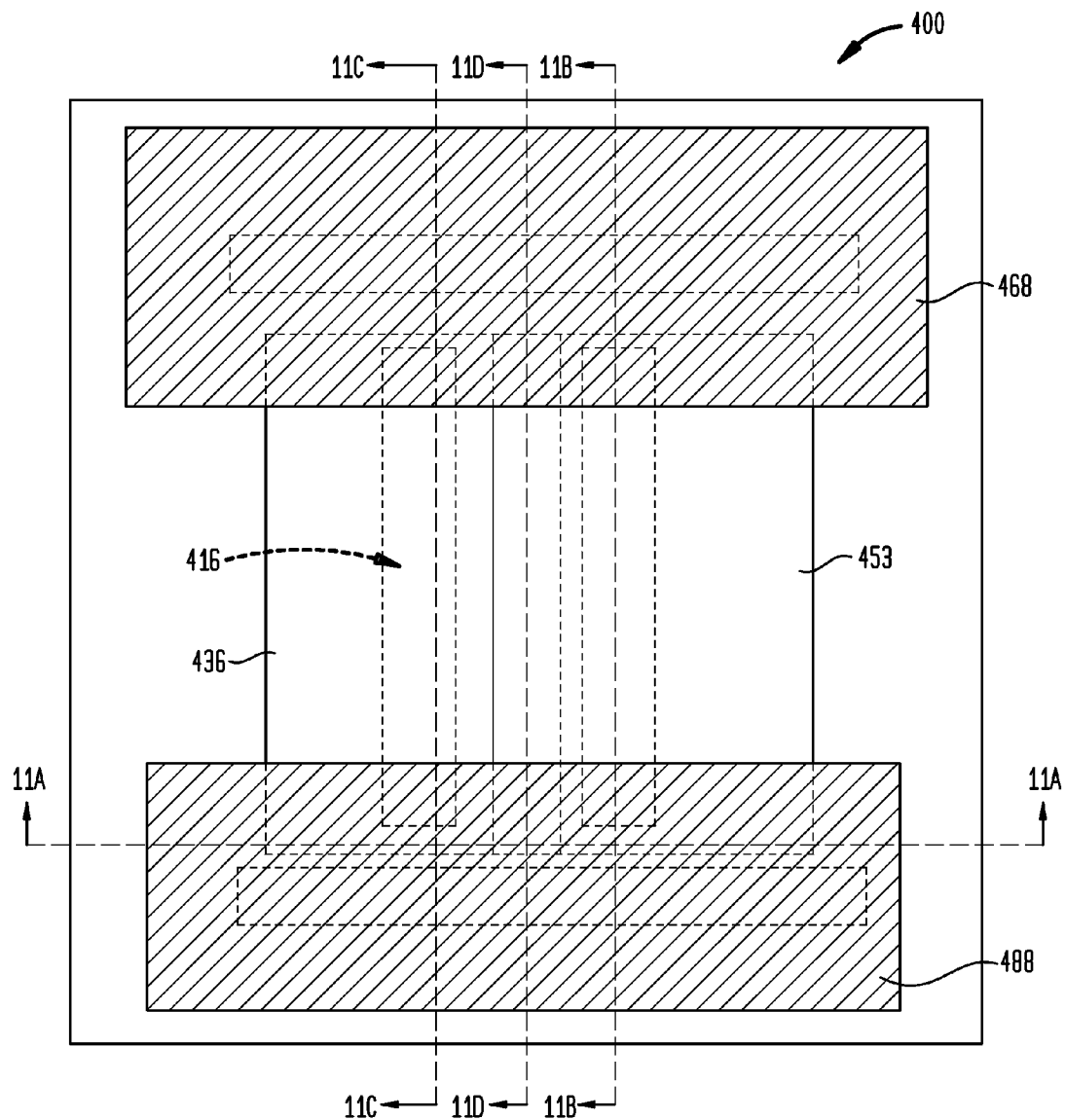

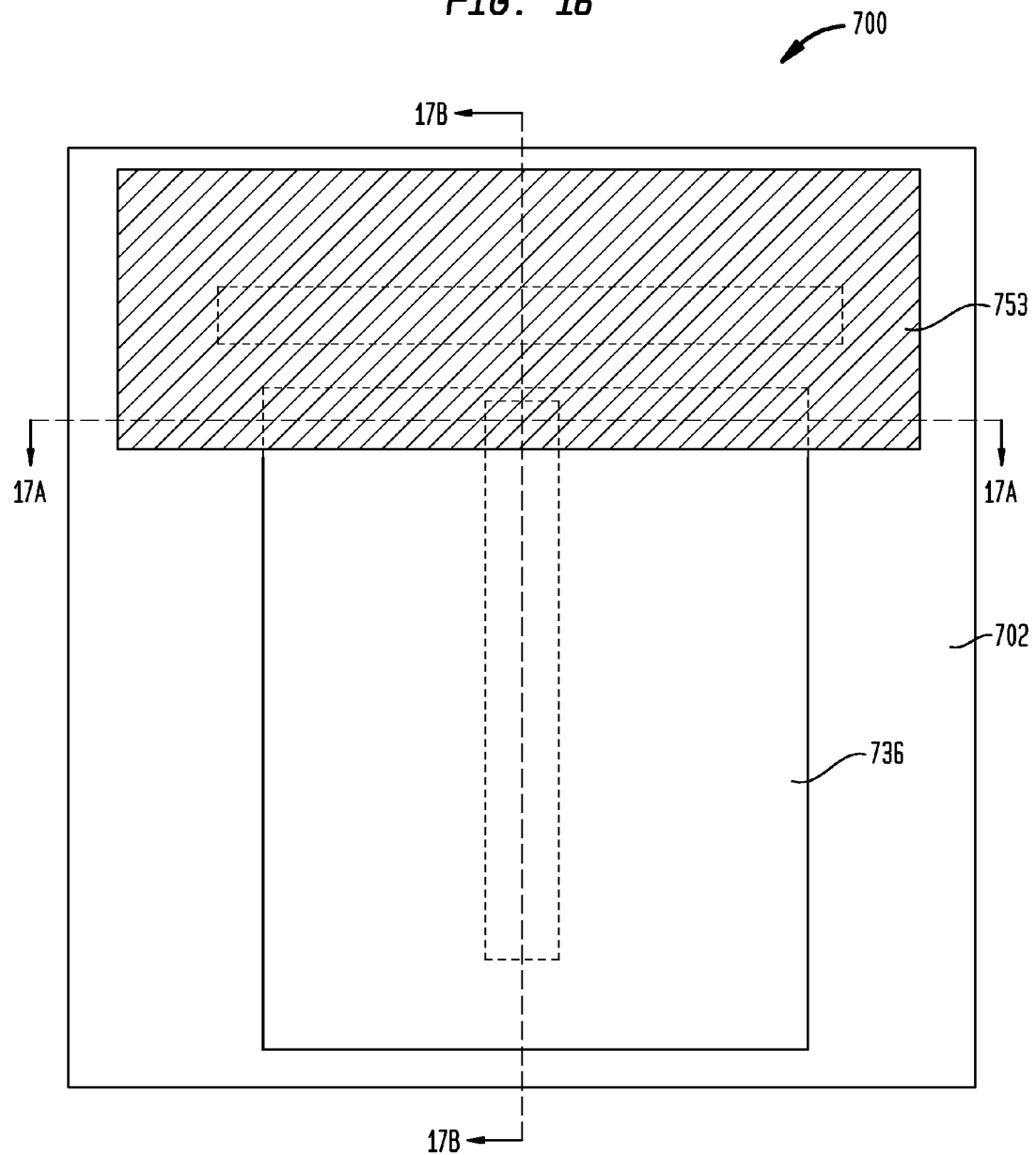

MULTIPLE DIE FACE-DOWN STACKING FOR TWO OR MORE DIE

CROSS-REFERENCE TO RELATED APPLICATIONS

The present application is a continuation of U.S. patent application Ser. No. 13/741,890, filed Jan. 15, 2013, which is a continuation of U.S. patent application Ser. No. 13/565,613, filed Aug. 2, 2012, which is a continuation-in-part of U.S. patent application Ser. No. 13/306,300, filed Nov. 29, 2011, which claims the benefit of the filing date of U.S. Provisional Patent Application No. 61/477,877, filed Apr. 21, 2011, the disclosures of all of which are hereby incorporated herein by reference. The following commonly-owned applications are hereby incorporated herein by reference: U.S. Provisional Patent Application Nos. 61/477,820, 61/477,883, and 61/477,967, all filed Apr. 21, 2011.

BACKGROUND OF THE INVENTION

The present invention is directed to microelectronic assemblies that include stacked semiconductor chips in a face-down orientation, as well as methods of manufacturing same.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a substrate, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

It is also desirable to produce a chip package that presents a low, overall height or dimension perpendicular to the plane of the circuit panel. Such thin microelectronic packages allow for placement of a circuit panel having the packages mounted therein in close proximity to neighboring structures, thus producing the overall size of the product incorporating the circuit panel. Various proposals have been advanced for providing plural chips in a single package or module. In the conventional "multi-chip module", the chips are mounted side-by-side on a single package substrate, which in turn can be mounted to the circuit panel. This approach offers only limited reduction in the aggregate area of the circuit panel occupied by the chips. The aggregate area is still greater than the total surface area of the individual chips in the module.

It has also been proposed to package plural chips in a "stack" arrangement, i.e., an arrangement where plural chips are placed one on top of another. In a stacked arrangement, several chips can be mounted in an area of the circuit panel that is less than the total area of the chips. Certain stacked chip arrangements are disclosed, for example, in certain embodiments of the aforementioned U.S. Pat. Nos. 5,679,977; 5,148,265; and U.S. Pat. No. 5,347,159, the disclosures of which are incorporated herein by reference. U.S. Pat. No. 4,941,033, also incorporated herein by reference, discloses an arrangement in which chips are stacked on top of another and interconnected with one another by conductors on so-called "wiring films" associated with the chips.

Despite these efforts in the art, further improvements would be desirable in the case of multi-chip packages for chips having contacts located substantially in central regions of the chips. Certain semiconductor chips, such as some memory chips, are commonly made with the contacts in one or two rows located substantially along a central axis of the chip.

SUMMARY OF THE INVENTION

In accordance with an aspect of the invention, a microelectronic assembly can include a substrate having first and second opposed surfaces each extending in first and second transverse directions, a peripheral edge extending between the first and second surfaces and in the second direction, first and second openings extending between the first and second surfaces, and a peripheral region of the second surface extending between the peripheral edge and one of the openings. Each of the openings can have an elongated first dimension extending in the first direction, and a second dimension in the second direction shorter than the first dimension.

The microelectronic assembly can also include a first microelectronic element having a front surface facing toward the first surface and bond pads at the front surface aligned with the first opening, a rear surface opposite from the front surface, and an edge extending between the front and rear surfaces. The microelectronic assembly can also include a second microelectronic element having a front surface facing toward the rear surface of the first microelectronic element and projecting beyond the edge of the first microelectronic element, and bond pads at the front surface of the second microelectronic element aligned with the second opening.

The microelectronic assembly can also include a plurality of terminals exposed at the second surface and electrically connected with the bond pads of the first and second microelectronic elements. The terminals can be configured for connecting the microelectronic assembly to at least one component external to the assembly. At least one of the terminals can be disposed at least partially within the peripheral region such that a straight line extending in the first direction and passing through the at least one terminal passes through or over at least one of the openings.

In one example, the peripheral edge can be a first peripheral edge, the peripheral region can be a first peripheral region, and the at least one of the terminals can be a first terminal. The substrate can have a second peripheral edge opposite the first peripheral edge extending between the first and second surfaces and in the second direction. The substrate can have a second peripheral region of the second surface extending between the second peripheral edge and the one of the openings. At least one of the terminals can be a second terminal disposed at least partially within the second peripheral region such that a straight line extending in the first direction and passing through the second terminal passes through or over at least one of the openings.

In a particular embodiment, the peripheral region can be a first peripheral region, the one of the openings can be the first opening, and the at least one of the terminals can be a first terminal. The substrate can have a second peripheral region of the second surface extending between the peripheral edge and the second opening. At least one of the terminals can be a second terminal disposed at least partially within the second peripheral region such that a straight line extending in the first direction and passing through the second terminal passes through or over the second opening.

In an exemplary embodiment, the peripheral edge can be a first peripheral edge, the substrate can have a second peripheral edge opposite the first peripheral edge extending between the first and second surfaces and in the second direction, and the substrate can have third and fourth peripheral regions of the second surface extending between the second peripheral edge and the respective first and second openings. At least one of the terminals can be a third terminal disposed at least partially within the third peripheral region such that a straight line extending in the first direction and passing through the third terminal passes through or over the first opening. At least one of the terminals can be a fourth terminal disposed at least partially within the fourth peripheral region such that a straight line extending in the first direction and passing through the fourth terminal passes through or over the second opening.

In one embodiment, the bond pads of the first and second microelectronic elements can be electrically connected to conductive elements of the substrate. In a particular example, the bond pads of the first microelectronic element can be electrically connected to the conductive elements by first leads having portions aligned with the first opening, and the bond pads of the second microelectronic element can be electrically connected to the conductive elements by second leads having portions aligned with the second opening. In one example, at least one of: the first leads may not extend through the first opening, or the second leads may not extend through the second opening. In a particular embodiment, the bond pads of the first microelectronic element can be electrically connected to the conductive elements by first wire bonds extending through the first opening, and the bond pads of the second microelectronic element can be electrically connected to the conductive elements by second wire bonds extending through the second opening. In one embodiment, the first wire bonds may extend through only the first opening, and the second wire bonds may extend through only the second opening.

In a particular example, the edge of the first microelectronic element can be a first edge and the first microelectronic element can have a second edge opposite therefrom. The second microelectronic element can have first and second opposed edges. Each microelectronic element can have at least one row of five or more of the bond pads extending in the first direction in a central region of the front surface thereof. Each central region can extending a middle third of a distance between the respective first and second edges. In one embodiment, each microelectronic element can embody a greater number of active devices to provide memory storage array function than any other function. In an exemplary embodiment, the first microelectronic element can have a width between the edge and an opposite edge extending between the front and rear surfaces thereof, and the second microelectronic element can have a width between opposed edges each extending between the front and rear surfaces thereof. The width of the first microelectronic element can be greater than the second dimension of the first opening, and the width of the second microelectronic element can be greater than the second dimension of the second opening.

In one embodiment, one of the first and second openings can extend to a location closer to the peripheral edge than the other one of the first and second openings. In a particular example, the substrate can have third and fourth openings extending between the first and second surfaces, each of the third and fourth openings having an elongated first dimension extending in the second direction, and a second dimension in the first direction shorter than the first dimension. The microelectronic assembly can also include third and fourth microelectronic elements each having a front surface facing the first surface of the substrate, the third and fourth microelectronic elements each having bond pads at a front surface thereof aligned with the respective third or fourth opening. The bond pads of the third and fourth microelectronic elements can be electrically connected to conductive elements of the substrate. In one example, the substrate can also include an aperture extending between the first and second surfaces in the peripheral region. The aperture can be configured to receive flow of an encapsulant or underfill material therethrough.

In accordance with another aspect of the invention, a microelectronic assembly can include a substrate having first and second opposed surfaces each extending in first and second transverse directions, a peripheral edge extending between the first and second surfaces and in the second direction, first and second openings extending between the first and second surfaces, the first opening located between the second opening and the peripheral edge, and a peripheral region of the second surface extending between the peripheral edge and the first opening. The first opening can have an elongated first dimension extending in the first direction and a second dimension in the second direction shorter than the first dimension. The second opening can have an elongated first dimension extending in the second direction and a second dimension in the first direction shorter than the first dimension.

The microelectronic assembly can also include a first microelectronic element having a front surface facing toward the first surface and bond pads at the front surface aligned with the first opening, a rear surface opposite from the front surface, and an edge extending between the front and rear surfaces. The microelectronic assembly can also include a second microelectronic element having a front surface facing toward the rear surface of the first microelectronic element and projecting beyond the edge of the first microelectronic element, and bond pads at the front surface of the second microelectronic element aligned with the second opening.

The microelectronic assembly can also include a plurality of terminals exposed at the second surface and electrically connected with the bond pads of the first and second microelectronic elements. The terminals can be configured for connecting the microelectronic assembly to at least one component external to the assembly. At least one of the terminals can be disposed at least partially within the peripheral region such that a straight line extending in the first direction and passing through the at least one terminal passes through or over the first opening.

In one example, the peripheral edge can be a first peripheral edge, the peripheral region can be a first peripheral region, and the at least one of the terminals can be a first terminal. The substrate can have a second peripheral edge extending between the first and second surfaces and in the first direction, and the substrate can have a second peripheral region of the second surface extending between the second peripheral edge and the second opening. At least one of the terminals can be a second terminal disposed at least partially within the second peripheral region such that a straight line extending in the second direction and passing through the second terminal passes through or over the second opening.

In a particular embodiment, the substrate can have a third peripheral edge opposite the second peripheral edge extending between the first and second surfaces and in the first direction, and the substrate can have a third peripheral region of the second surface extending between the third peripheral edge and the second opening. At least one of the terminals can be a third terminal disposed at least partially within the third peripheral region such that a straight line extending in the second direction and passing through the third terminal passes through or over the second opening.

In accordance with yet another aspect of the invention, a microelectronic assembly can include a substrate having first and second opposed surfaces each extending in first and second transverse directions, a peripheral edge extending between the first and second surfaces and in the first direction, a first opening extending between the first and second surfaces and having an elongated first dimension extending in the first direction and a second dimension in the second direction shorter than the first dimension, a second opening extending between the first and second surfaces and having an elongated first dimension extending in the second direction and a second dimension in the first direction shorter than the first dimension, and a peripheral region of the second surface extending between the peripheral edge and the second opening.

The microelectronic assembly can also include a first microelectronic element having a front surface facing toward the first surface and bond pads at the front surface aligned with the first opening, a rear surface opposite from the front surface, and an edge extending between the front and rear surfaces. The microelectronic assembly can also include a second microelectronic element having a front surface facing toward the rear surface of the first microelectronic element and projecting beyond the edge of the first microelectronic element, and bond pads at the front surface of the second microelectronic element aligned with the second opening.

The microelectronic assembly can also include a plurality of terminals exposed at the second surface and electrically connected with the bond pads of the first and second microelectronic elements. The terminals can be configured for connecting the microelectronic assembly to at least one component external to the assembly. At least one of the terminals can be disposed at least partially within the peripheral region such that a straight line extending in the second direction and passing through the at least one terminal passes through or over the second opening.

In one example, the peripheral edge can be a first peripheral edge, the peripheral region can be a first peripheral region, and the at least one of the terminals can be a first terminal. The substrate can have a second peripheral edge opposite the first peripheral edge extending between the first and second surfaces and in the first direction, and the substrate can have a second peripheral region of the second surface extending between the second peripheral edge and the second opening. At least one of the terminals can be a second terminal disposed at least partially within the second peripheral region such that a straight line extending in the second direction and passing through the second terminal passes through or over the second opening.

In a particular embodiment, the peripheral region can be a first peripheral region, the at least one of the terminals can be a first terminal, the edge of the first microelectronic element can be a first edge, and the substrate can have a third opening extending between the first and second surfaces and having an elongated first dimension extending in the second direction and a second dimension in the first direction shorter than the first dimension. The substrate can have a second peripheral region of the second surface extending between the peripheral edge and the third opening. At least one of the terminals can be a second terminal disposed at least partially within the second peripheral region such that a straight line extending in the second direction and passing through the second terminal passes through or over the third opening. The microelectronic assembly can also include a third microelectronic element having a front surface facing toward the rear surface of the first microelectronic element and projecting beyond a second edge of the first microelectronic element opposite the first edge thereof, and bond pads at the front surface of the third microelectronic element aligned with the third opening.

In an exemplary embodiment, the front surfaces of the second and third microelectronic elements can be positioned in a single plane. In one embodiment, the peripheral edge can be a first peripheral edge, the substrate can have a second peripheral edge opposite the first peripheral edge extending between the first and second surfaces and in the first direction, and the substrate can have third and fourth peripheral regions of the second surface extending between the second peripheral edge and the respective second and third openings. At least one of the terminals can be a third terminal disposed at least partially within the third peripheral region such that a straight line extending in the second direction and passing through the third terminal passes through or over the first opening. At least one of the terminals can be a fourth terminal disposed at least partially within the fourth peripheral region such that a straight line extending in the second direction and passing through the fourth terminal passes through or over the second opening.

In particular example, the substrate can have a fourth opening extending between the first and second surfaces and having an elongated first dimension extending in the first direction and a second dimension in the second direction shorter than the first dimension. The microelectronic assembly can also include a fourth microelectronic element having bond pads at a front surface thereof aligned with the fourth opening. In one example, the second, third, and fourth microelectronic elements can each have first and second opposed edges. Each microelectronic element can have at least one row of five or more of the bond pads extending in a direction parallel to the first and second edges thereof in a central region of the front surface thereof. Each central region can extend a middle third of a distance between the respective first and second edges.

In accordance with still another aspect of the invention, a microelectronic assembly can include a substrate having first and second dielectric elements each having top and bottom opposed surfaces. Each surface can extend in first and second transverse directions. The dielectric elements can be spaced apart from one another in at least one of the first or second transverse directions. A first surface of the substrate can include the top surfaces of both dielectric elements. A second surface of the substrate can include the bottom surfaces of both dielectric elements. The substrate can also have a first opening defined by an open area between adjacent opposed edges of the first and second dielectric elements, the adjacent opposed edges each having a first dimension extending in the first direction, the first opening having a second dimension in the second direction shorter than the first dimension, and a second opening enclosed by the second dielectric element.

The microelectronic assembly can also include a first microelectronic element having a front surface facing toward the first surface and bond pads at the front surface aligned with one of the first and second openings, a rear surface opposite from the front surface, and an edge extending between the front and rear surfaces. The microelectronic assembly can also include a second microelectronic element having a front surface facing toward the rear surface of the first microelectronic element and projecting beyond the edge of the first microelectronic element, and bond pads at the front surface of the second microelectronic element aligned with the other one of the first and second openings. The microelectronic assembly can also include a plurality of terminals exposed at the second surface and electrically connected with the bond pads of the first and second microelectronic elements. The terminals can be configured for connecting the microelectronic assembly to at least one component external to the assembly.

In a particular embodiment, the second opening can have an elongated first dimension extending in the first direction and a second dimension in the second direction shorter than the first dimension. In one example, the second opening can have an elongated first dimension extending in the second direction and a second dimension in the first direction shorter than the first dimension. In an exemplary embodiment, the substrate can also include a dielectric region extending between the adjacent opposed edges of the first and second dielectric elements. The first surface of the substrate can include a top surface of the dielectric region. The second surface can include a bottom surface of the dielectric region. In a particular example, the dielectric region can have a higher Young's modulus in a plane of the substrate than the dielectric elements.

In one embodiment, the bond pads at the front surface of the first microelectronic element can be aligned with the first opening, and the bond pads at the front surface of the second microelectronic element can be aligned with the second opening. In a particular embodiment, the terminals can include first and second terminals exposed at the bottom surface of the respective first and second dielectric elements. At least some of the bond pads of the first microelectronic element can be electrically connected to the first and second terminals. In one example, the bond pads at the front surface of the first microelectronic element can be aligned with the second opening. The bond pads at the front surface of the second microelectronic element can be aligned with the first opening.

In accordance with another aspect of the invention, a microelectronic assembly can include a substrate having first and second opposed surfaces each extending in first and second transverse directions. The substrate can have first and second dielectric elements spaced apart from one another in at least one of the first or second transverse directions. The microelectronic assembly can also include a first microelectronic element having a front surface facing toward the first surface and bond pads at the front surface, a rear surface opposite from the front surface, and an edge extending between the front and rear surfaces. The microelectronic assembly can also include a second microelectronic element having a front surface facing toward the rear surface of the first microelectronic element and projecting beyond the edge of the first microelectronic element, and bond pads at the front surface of the second microelectronic element. The microelectronic assembly can also include a plurality of terminals exposed at the second surface and electrically connected with the bond pads of the first and second microelectronic elements. The terminals can be configured for connecting the microelectronic assembly to at least one component external to the assembly.

In one example, at least one of the microelectronic elements can at least partially overlies the top surface of each of the first and second dielectric elements. In an exemplary embodiment, the edge of the first microelectronic element can be a first edge and the first microelectronic element can have a second edge opposite therefrom. The second microelectronic element can have first and second opposed edges. Each microelectronic element can have at least one row of five or more of the bond pads extending in the first direction in a central region of the front surface thereof. Each central region can extend a middle third of a distance between the respective first and second edges.

In accordance with yet another aspect of the invention, a microelectronic assembly can include a substrate having first, second, and third dielectric elements each having top and bottom opposed surfaces. Each surface can extend in first and second transverse directions. The dielectric elements can be spaced apart from one another in at least one of the first or second transverse directions. A first surface of the substrate can include the top surfaces of the first, second, and third dielectric elements. A second surface of the substrate can include the bottom surfaces of the first, second, and third dielectric elements. The substrate can also have a first opening defined by an open area between adjacent opposed edges of the first and second dielectric elements. The adjacent opposed edges can each have a first dimension extending in the first direction. The first opening can have a second dimension in the second direction shorter than the first dimension. The substrate can also have a second opening defined by an open area between adjacent opposed edges of the second and third dielectric elements. The adjacent opposed edges can each have a first dimension extending in the first direction. The first opening can have a second dimension in the second direction shorter than the first dimension.

The microelectronic assembly can also include a first microelectronic element having a front surface facing toward the first surface and bond pads at the front surface aligned with one of the first and second openings, a rear surface opposite from the front surface, and an edge extending between the front and rear surfaces. The microelectronic assembly can also include a second microelectronic element having a front surface facing toward the rear surface of the first microelectronic element and projecting beyond the edge of the first microelectronic element, and bond pads at the front surface of the second microelectronic element aligned with the other one of the first and second openings. The microelectronic assembly can also include a plurality of terminals exposed at the second surface and electrically connected with the bond pads of the first and second microelectronic elements. The terminals can be configured for connecting the microelectronic assembly to at least one component external to the assembly.

In one embodiment, the bond pads at the front surface of the first microelectronic element can be aligned with the first opening, and the bond pads at the front surface of the second microelectronic element can be aligned with the second opening. In a particular example, the first microelectronic element can at least partially overlie the top surface of each of the first and second dielectric elements, and the second microelectronic element can at least partially overlie the top surface of each of the second and third dielectric elements. In an exemplary embodiment, the bond pads at the front surface of the first microelectronic element can be aligned with the second opening, and the bond pads at the front surface of the second microelectronic element can be aligned with the first opening.

In a particular embodiment, the terminals can include first, second, and third terminals exposed at the bottom surface of the respective first, second, and third dielectric elements. At least some of the bond pads of at least one of the microelectronic elements can be electrically connected with two or more of the first, second, and third terminals. In one example, at least some of the bond pads of the first microelectronic element can be electrically connected to the first and second terminals. In a particular example, at least some of the bond pads of the second microelectronic element can be electrically connected to the second and third terminals.

In an exemplary embodiment, the substrate can have a peripheral edge extending between the first and second surfaces and in the second direction and a peripheral region of the second surface extending between the peripheral edge and one of the openings. At least one of the terminals can be disposed at least partially within the peripheral region such that a straight line extending in the first direction and passing through the at least one terminal passes through or over at least one of the openings.

In one example, the peripheral region can be a first peripheral region, the one of the openings can be the first opening, and the at least one of the terminals can be a first terminal. The substrate can have a second peripheral region of the second surface extending between the peripheral edge and the second opening. At least one of the terminals can be a second terminal disposed at least partially within the second peripheral region such that a straight line extending in the first direction and passing through the second terminal passes through or over the second opening. In a particular embodiment, the second dielectric element can include portions of both the first and second peripheral regions. In one embodiment, the first dielectric element can include a portion of the first peripheral region, and the third dielectric element can include a portion of the second peripheral region.

In a particular example, a system can include a microelectronic assembly as described above and one or more other electronic components electrically connected to the microelectronic assembly. In one example, the system can also include a housing, the microelectronic assembly and the other electronic components being mounted to the housing.

BRIEF DESCRIPTION OF THE DRAWINGS

FIG. 1 is top plan view of an embodiment of the present invention.

FIG. 1B is a bottom plan view of a microelectronic element in the embodiment of FIG. 1.

FIG. 1C is a bottom plan view of another microelectronic element in the embodiment of FIG. 1.

FIG. 3D is yet another potential bottom view of the embodiment of FIG. 3A, having three dielectric elements.

FIG. 3E-3G are variations of the embodiment of FIG. 3D.

FIG. 10 is plan view of an alternative embodiment of the present invention.

FIG. 16 is a top plan view of an alternative embodiment of the present invention.

DETAILED DESCRIPTION OF THE INVENTION

Figure 1A:
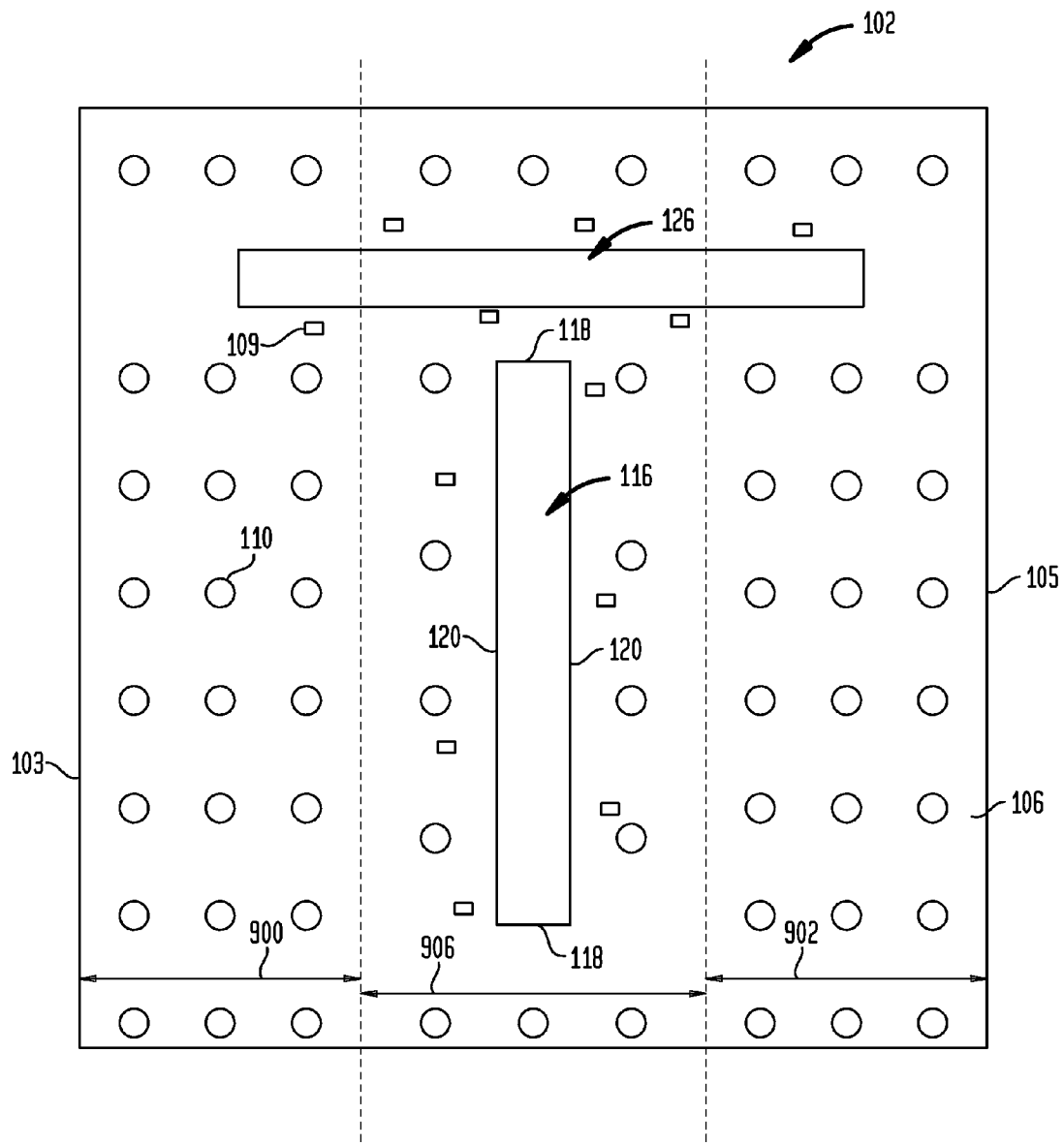
FIG. 1A is a bottom plan view of a component of the embodiment of FIG. 1.
Figure 2A:
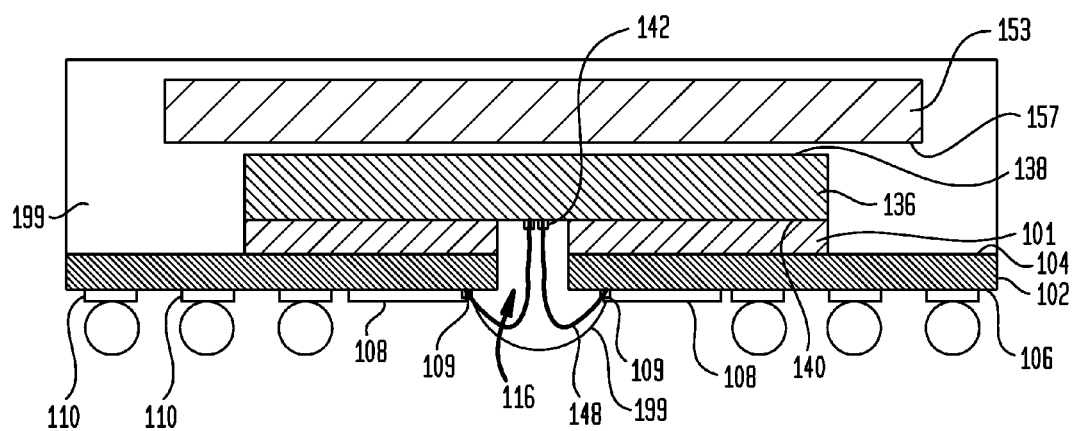
FIG. 2A is a cross-section of FIG. 1 taken through 2A-2A.
Figure 2B:
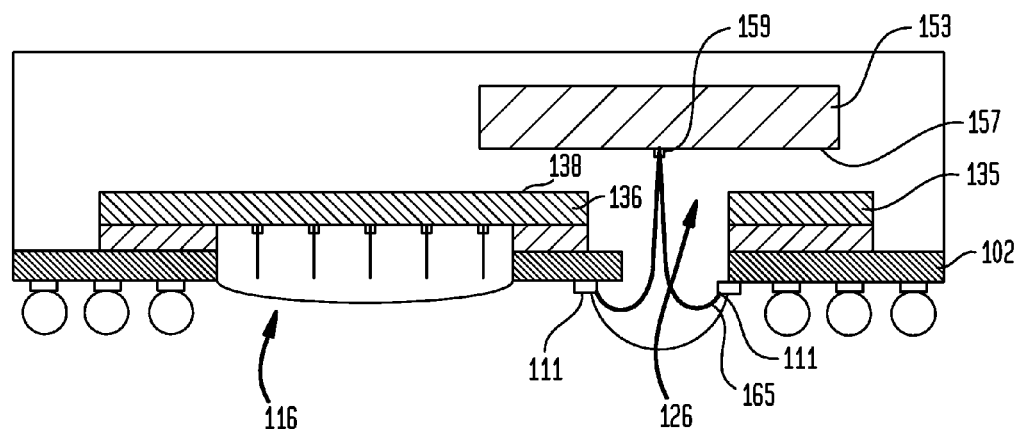
FIG. 2B is a cross-section of FIG. 1 taken through line 2B-2B.
Figure 3:
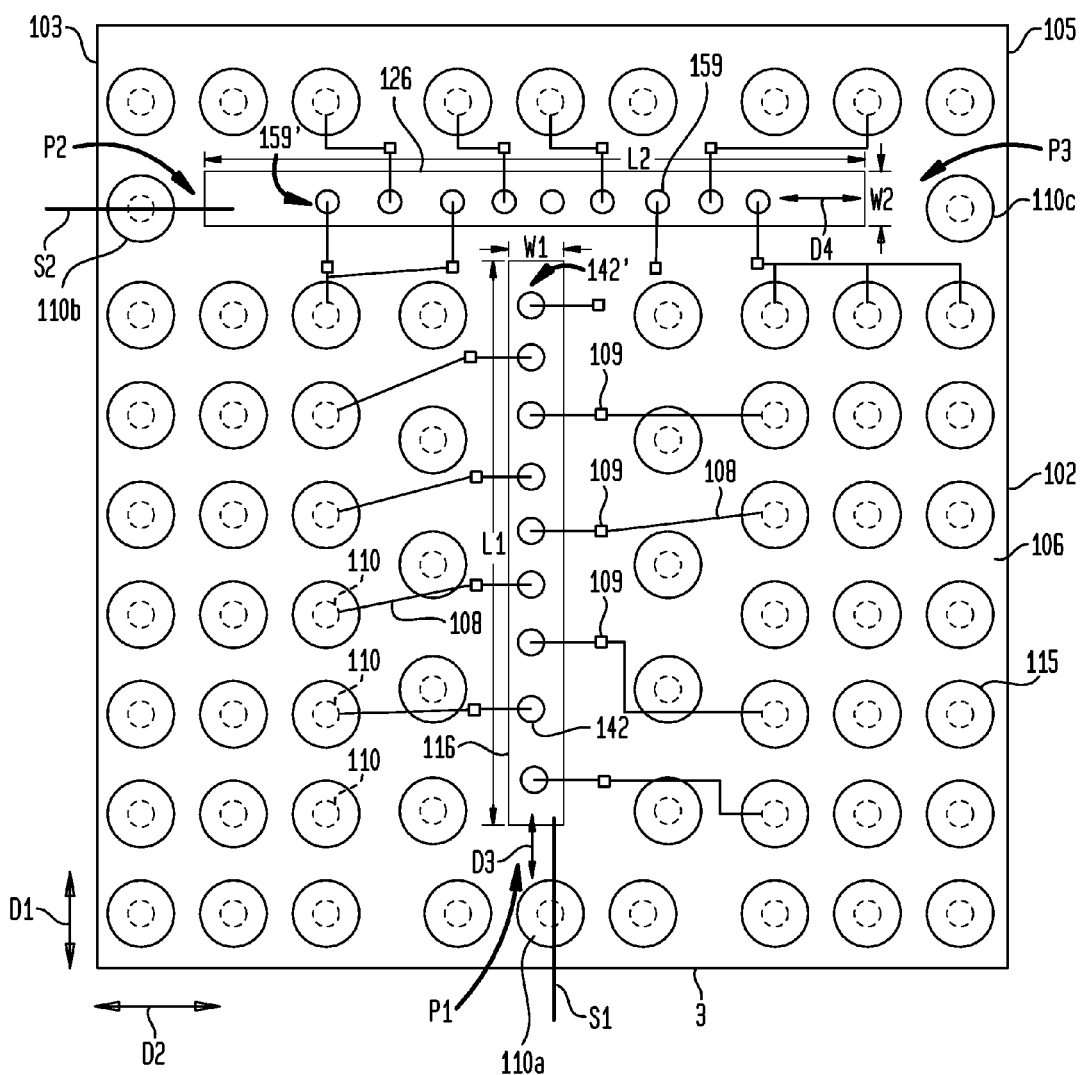
FIG. 3 is a bottom view of the embodiment shown in FIG. 1.

FIGS. 1-3 illustrate different views of a microelectronic package or microelectronic assembly 100 in accordance with an embodiment of the present invention. With reference to FIG. 1, a microelectronic assembly 100 includes two microelectronic elements overlying a substrate 102. The microelectronic elements are stacked in a face-down position, such that at least a portion of the second microelectronic element 153 overlies a rear surface 138 (FIG. 2A) of first microelectronic element 136.

The first and second microelectronic elements 136,153 may be positioned on the substrate 102 so that the outer edges (i.e., first, second, third, fourth edges 144,145,146, 147) of the first microelectronic element 136 and outer edges (i.e., first, second, third, fourth edges 161,162,163,164) of the second microelectronic element 153 are positioned on the first surface 104 of the substrate 102 and do not extend beyond the peripheral edge of the substrate 102.

In particular embodiments, the substrate can be a dielectric element of various types of construction, such as of polymeric material or inorganic material such as ceramic or glass, the substrate having conductive elements thereon such as terminals and leads, e.g., traces, substrate contacts, or other conductive elements electrically connected with the terminals. In another example, the substrate can consist essentially of a semiconductor material such as silicon, or alternatively include a layer of semiconductor material and one or more dielectric layers thereof. In yet another embodiment, the substrate can be a lead frame having leads, wherein the terminals can be portions of the leads, such as end portions of the leads.

As best shown in FIGS. 2A, 2B, the substrate 102 includes a first surface 104 and a second surface 106 opposite from the first surface, the first and second surfaces each extending in first and second transverse directions D1, D2. Although the thickness of the substrate 102 will vary with the application, the substrate 102 most typically is about 10 to 100 micrometers (microns) thick. The substrate 102 may have conductive traces 108 and a plurality of contacts, such as terminal contacts 110, first set of contacts 109, and second set of contacts 111 exposed at a surface thereof. As used in this disclosure, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure may project from such surface; may be flush with such surface; or may be recessed relative to such surface and exposed through a hole or depression in the structure.

Referring to FIG. 1A, between an opposed pair of edges, the first surface 104 of the substrate 102 may include three portions which divide the width of the substrate 102 between first and second edges 103,105 of the substrate 102. The three portions, which may have the same or different widths may include: a first outer portion 900 adjacent the first edge 103 of the substrate 102, a second outer portion 902 adjacent the second edge 105 of the substrate 102, and a central portion 906 occupying the area between the first and second outer portions 900,902. In one embodiment, conductive traces 108 and the plurality of contacts are exposed at one or more of these portions on the second surface 106 of the substrate 102. In other embodiments, the conductive traces 108 and contacts may extend on both the first 104 and second 106 surfaces of the substrate 102 or within the interior of substrate 102.

Conductive traces 108 may be formed from any electrically conductive material, but most typically are formed from copper, copper alloys, gold or combinations of these materials. The thickness of the traces will also vary with the application, but typically is about 5 to 25 microns. The substrate 102 and traces 108 can be fabricated by a process such as that disclosed in co-pending, commonly assigned U.S. Pat. No. 7,462,936, the disclosure of which is incorporated by reference herein.

Referring to FIGS. 1, 1A, 2B, and 3, the substrate 102 may further include at least two apertures or openings extending between the first surface 104 and second surface 106 of the substrate 102. The first opening 116 may be positioned on the central portion 906 (FIG. 1A) of the substrate 102 and have a pair of short edges 118 and a pair of long edges 120 that have a length that is greater than the length of the short edges 118. The first opening 116 can extend in a first direction D1. A second opening 126 may extend in a second direction D2 transverse to the first direction D1. In this embodiment, the second direction D2 in which the second opening 126 extends can be perpendicular to the first direction D1 in which the first opening 116 extends, so that the first and second openings 116, 126 can form the shape of a T. It is to be appreciated that the first and second openings 116, 126 may alternatively be joined together to form one continuous opening. In another alternative embodiment, the first opening 116 or second opening 126 may each be comprised of a plurality of openings, such that the first opening 116 includes a plurality of openings extending in the first direction D1, and the second opening 126 includes a plurality of openings extending in the second direction D2 transverse to the first direction D1. It is to be further appreciated that the openings can also have any alternative shape or design.

In one example, the first opening 116 can have a long dimension A1 greater than a short dimension A2, the long dimension A1 extending in the first direction D1, and the short dimension A2 extending in the second direction D2. The second opening 126 can have a long dimension B1 greater than a short dimension B2, the long dimension B1 extending in the second direction D2, and the short dimension B2 extending in the first direction D1.

Referring now to FIGS. 2A-2B, the first microelectronic element 136 has a front surface 140 that faces toward and can be attached to the first surface 104 of the substrate 102 using know bonding materials or techniques, such as using an adhesive 101. The first microelectronic element 136 further includes a rear surface 138 opposite from its front surface 140. In this embodiment, the front surface 140 is a first surface of the microelectronic element 136, having bond pads 142 thereon, and the rear surface 138 is a rear surface thereof. In this embodiment, opposed first and second edges 144, 145 and opposed third and fourth edges 146, 147 of the first microelectronic element 136 extend between the first surface 104 and second surface 106 of the substrate 102. The edges of the first microelectronic element 136 may be of equal or different lengths.

Turning to FIG. 1B, the first microelectronic element 136 may be any type of semiconductor chip. In this embodiment, the first microelectronic element 136 can be a DRAM (dynamic random access memory) chip having conductive elements thereon. As shown, the surface area of the front surface 140 of the first microelectronic element 136 may be divided into three regions having substantially equal widths in a direction between the first and second edges of the first microelectronic element: a first outer region 920, a second outer region 922, and a central region 924 positioned between the first outer region 920 and second outer region 922. For example, if the length between the long edges is 6 microns, the respective lengths of the first outer, second outer, and central regions may be 2 microns. The central region 924 would therefore be positioned 2 microns from the first edge 144 and 2 microns from the second edge 145. In other words, the central region can be positioned in the middle third of the first microelectronic element 136. Any or all of the microelectronic elements described herein can each embody a greater number of active devices to provide memory storage array function than any other function.

As is typical with regard to DRAM chips, the conductive elements may include first bond pads 142 that extend along the central region 924 of the front surface 140 of the first microelectronic element 136. The conductive elements provide for an electrical connection between the first microelectronic element 136 and the first set of contacts 109 positioned on the second surface 106 of the substrate 102. An adhesive 101 can be used to attach the first microelectronic element 136 to the substrate 102.

Referring to FIGS. 2A and 2B, the bond pads 142 of the first microelectronic element 136 may be positioned directly over the first opening 117 of the substrate 102. This allows the bond pads 142 to be exposed through the first opening 117. The bond pads 142 may be electrically connected to a first set of contacts 109 on the second surface 106 of the substrate 102 using any known methods of establishing an electrical connection. In one embodiment, bond wires 148 can extend from the bond pads 142 on the first microelectronic element 136, through the first opening 116, and to the first set of contacts 109 on the second surface 106 of the substrate 102. Traces 108 (FIG. 3) can be used to connect the first set of contacts 109 to terminal contacts 110.

The second microelectronic element 153 may be similar to the first microelectronic element 136. A front surface 157 of the second microelectronic element having bond pads thereon, faces forward the first microelectronic element 136, such that the second microelectronic element 153 overlies the rear surface 138 of the first microelectronic element 136. As shown in FIG. 1C, in this embodiment, the second microelectronic element 153 has opposed first and second edges 161,162 and opposed third and fourth edges 163,164 extending between the rear surface 155 and front surface 157 of the second microelectronic element 153 and adjacent first and second edges 161,162. Conductive elements, such as bond pads 159, extend along the front surface 157 of the second microelectronic element 153. In this embodiment, the second microelectronic element 153 may be a semiconductor chip, such as a DRAM chip, with bond pads 159 positioned along a central region 932 of the second microelectronic element 153, which is positioned between a first outer region 928 and a second outer region 930. In one embodiment, bond pads 159 can extend in a direction transverse to the direction bond pads 142 on the first microelectronic element 136 extend.

As can be seen in FIG. 1B, in a particular example, the first microelectronic element 136 can have at least one row 142' of five or more bond pads 142 extending in a direction D3 in the central region 924 of the front surface 140 of the first microelectronic element. As can be seen in FIG. 1C, in one example, the second microelectronic element 153 can have at least one row 159' of five or more bond pads 159 extending in a direction D4 in the central region 932 of the front surface 157 of the second microelectronic element. As shown in the example of FIG. 3, the direction D3 in which the row 142' of bond pads 142 extends can be transverse to the direction D4 in which the row 159' of bond pads 159 extends. As shown in FIG. 3, the direction D3 can be parallel to the direction D1 in which the long dimension of the first opening 116 extends, and the direction D4 can be parallel to the direction D2 in which the long dimension of the second opening 126 extends, but that need not be the case. For example, in one embodiment (not shown), the direction D3 can be parallel to the direction D2 in which the short dimension of the first window extends, and the direction D4 can be parallel to the direction D1 in which the short dimension of the second window extends.

Turning to FIG. 2B, the second microelectronic element 153 may be positioned above the first microelectronic element 136. As shown, a spacer 135 may be positioned between the substrate 102 and the second microelectronic element 153 to support the second microelectronic element 153 at a height above the first microelectronic element 136. As best seen in FIG. 1, the first and second edges 161,162 of the second microelectronic element 153 may extend in a direction that is transverse to the first and second edges 144,145 of the first microelectronic element 136. As a result, the first and second edges 161,162 of the second microelectronic element 153 extend beyond one of the third and fourth edges 146,147 of the first microelectronic element 136.

Referring to FIG. 2B, bond pads 159 on the second microelectronic element 153 may be electrically connected with a second set of contacts 111 of the plurality of contacts exposed at the substrate 102.

Conductive elements may be used to electrically connect the bond pads 159 on the first microelectronic element 136 with a second set of contacts 111 on the second surface 106 of the substrate 102. In this embodiment, bond wires 165 may be used to connect the bond pads 159 on the second microelectronic element 153 with the second set of contacts 111 (FIGS. 2B-3) on the second surface 106 of the substrate 102. As shown, bond wires 165 extend through the second opening 126 and connect to the second set of contacts 111.

As shown in FIG. 2A, once the stacked assembly is assembled, an encapsulant 199 may overlie some or all of the first surface 104 of the substrate 102, and the first and second microelectronic elements 136,153, and may cover bond wires 148,165 extending through the respective first opening 116 and second opening 126.

Referring to FIG. 3, an array of solder balls 115 may be attached to terminal contacts 110 (FIG. 2B) exposed at the second surface 106 of the substrate 102. As shown, traces 108 can extend from the first set of contacts 109 along the second surface 106 to provide an electrical connection between the first set of contacts 109 and terminal contacts 110 supporting the solder balls 115. The terminals 110 can be configured for connecting the microelectronic assembly 100 to at least one component external to the assembly.

In a particular example, the substrate 102 can also have a first peripheral edge 3 extending between the first and second surfaces 104, 106 and in the second direction D2. The substrate 102 can also have a second peripheral edge 103 extending between the first and second surface 104, 106 and in the first direction D1. The substrate 102 can also have a third peripheral edge 105 opposite the second peripheral edge 103 extending between the first and second surfaces 104, 106 and in the first direction D1.

The first opening 116 can be located between the second opening 126 and the first peripheral edge 3 and can have an elongated first dimension L1 extending in the first direction D1 and a second dimension W1 in the second direction D2 shorter than the first dimension. The second opening 126 can have an elongated first dimension L2 extending in the second direction D2 and a second dimension W2 in the first direction D1 shorter than the first dimension.

The substrate 102 can have a first peripheral region P1 of the second surface 106 extending between the first peripheral edge 3 and the first opening 116. The substrate 102 can also have a second peripheral region P2 of the second surface 106 extending between the second peripheral edge 103 and the second opening 126. The substrate 102 can also have a third peripheral region P3 of the second surface 106 extending between the third peripheral edge 105 and the second opening 126. The second and third peripheral regions P2, P3 can be located at opposite sides of the second opening 126.

As shown in FIG. 3, at least one of the terminals 110, for example a first terminal 110a, can be disposed at least partially within the first peripheral region P1 such that a straight line S1 extending in the first direction D1 and passing through the first terminal 110a passes through or over the first opening 116. At least one of the terminals 110, for example a second terminal 110b, can be disposed at least partially within the second peripheral region P2 such that a straight line S2 extending in the second direction D2 and passing through the second terminal passes through or over the second opening 126. At least one of the terminals 110, for example a third terminal 110c, can be disposed at least partially within the third peripheral region P3 such that a straight line extending in the second direction D2 and passing through the third terminal passes through or over the second opening 126. In a particular example, the same straight line S2 can extend through the second terminal 110b and the third terminal 110c, but that need not be the case.

The remaining embodiments, discussed herein, are substantially similar to the embodiment of FIGS. 1-3. Each differ only with respect to the way in which microelectronic elements are positioned in a front surface or face-down position over a substrate and the respective openings in the substrate. The principles disclosed regarding the embodiment of FIGS. 1-3 are therefore equally applicable to the remaining embodiments disclosed herein. Accordingly, similar reference numerals will be used to describe similar elements.

Figure 3A:
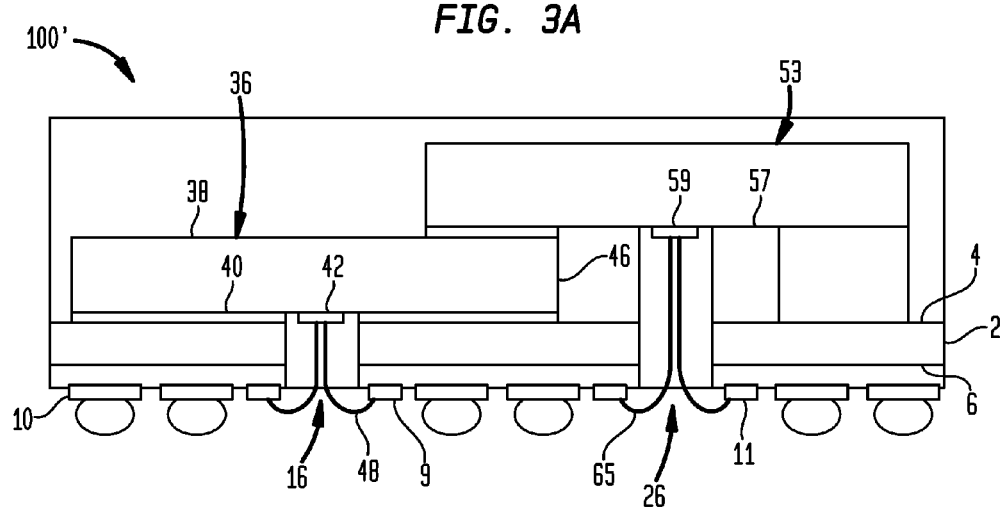
FIG. 3A is a cross-section of an alternative embodiment of the present invention.
Figure 3B:
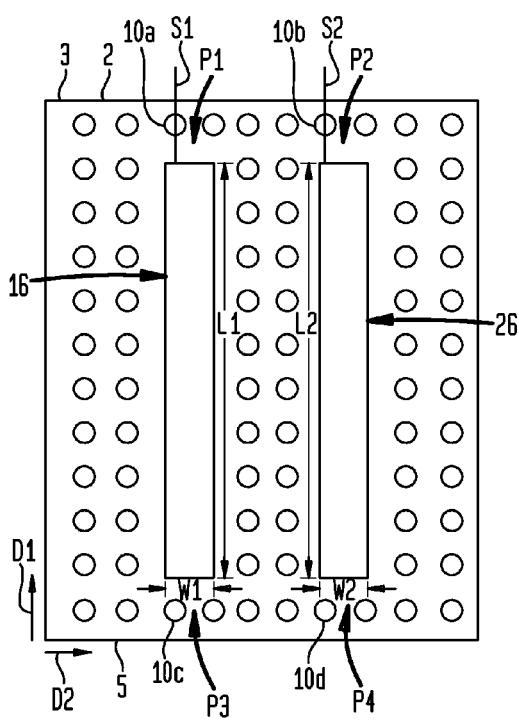
FIG. 3B is one potential bottom view of the embodiment of FIG. 3A.

Referring to FIGS. 3A and 3B, the microelectronic assembly 100' is similar to the microelectronic assembly shown and described with respect to FIGS. 1-3, except that the first and second openings 16, 26 each have a respective elongated first dimension L1, L2 extending in the first direction D1 and a respective second dimension W1, W2 extending in the second direction. That is, the first and second openings 16, 26 extend parallel to one another rather than transverse to one another.

As can be seen in FIG. 3A, similar to FIGS. 1-3, a first microelectronic element 36 has a front surface 40 facing toward the first surface 4 of the substrate 2 and bond pads 42 at the front surface aligned with the first opening 16, a rear surface 38 opposite from the front surface, and an edge 46 extending between the front and rear surfaces. A second microelectronic element 53 has a front surface 57 facing the rear surface 38 of the first microelectronic element 36 and projecting beyond the edge 46 of the first microelectronic element, and bond pads 59 at the front surface of the second microelectronic element aligned with the second opening 26.

In a particular example, the first microelectronic element 36 can have a width between the edge 46 and an opposite edge extending between the front and rear surfaces thereof, and the second microelectronic element 53 can have a width between opposed edges each extending between the front and rear surfaces thereof. The width of the first microelectronic element 36 can be greater than the second W1 dimension of the first opening 16, and the width of the second microelectronic element 53 can be greater than the second dimension W2 of the second opening 26.

An array of solder balls 15 may be attached to terminal contacts 10 exposed at the second surface 6 of the substrate 2. Traces can extend from first and second sets of substrate contacts 9, 11 along the second surface 6 to provide an electrical connection between the substrate contacts 9, 11 and the terminal contacts 10 supporting the solder balls 15. The bond pads 42, 59 of the respective first and second microelectronic elements 36, 53 can be electrically connected with conductive elements of the substrate 2 (e.g., the substrate contacts 9, 11 and the terminals 10). The terminals 10 can be configured for connecting the microelectronic assembly 100' to at least one component external to the assembly.

In a particular example, the substrate 2 can also have first and second opposed peripheral edges 3, 5 each extending between the first and second surfaces 4, 6 and in the second direction D2. The substrate 2 can have first and second peripheral regions P1, P2 of the second surface 6 extending between the first peripheral edge 3 and the respective first and second openings 16, 26. The substrate 2 can also have third and fourth peripheral regions P3, P4 of the second surface 6 extending between the second peripheral edge 5 and the respective first and second openings 16, 26. The first and third peripheral regions P1, P3 can be located at opposite sides of the first opening 16, and the second and fourth peripheral regions P2, P4 can be located at opposite sides of the second opening 26.

As shown in FIG. 3B, the first opening 16 extends to a location that is the same distance from the first peripheral edge 3 as the second opening 26, and the first opening extends to a location that is the same distance from the second peripheral edge 5 as the second opening, but that need not be the case. In one example, one of the first and second openings 16, 26 can extend to a location closer to one or both of the peripheral edges 3, 5 than the other one of the first and second openings.

As shown in FIG. 3B, at least one of the terminals 10, for example a first terminal 10a, can be disposed at least partially within the first peripheral region P1 such that a straight line S1 extending in the first direction D1 and passing through the first terminal 10a passes through or over the first opening 16. At least one of the terminals 10, for example a second terminal 10b, can be disposed at least partially within the second peripheral region P2 such that a straight line S2 extending in the first direction D1 and passing through the second terminal passes through or over the second opening 26.

At least one of the terminals 10, for example a third terminal 10c, can be disposed at least partially within the third peripheral region P3 such that a straight line extending in the second direction D3 and passing through the third terminal passes through or over the first opening 16. At least one of the terminals 10, for example a fourth terminal 10d, can be disposed at least partially within the fourth peripheral region P4 such that a straight line extending in the first direction D1 and passing through the fourth terminal passes through or over the second opening 26. In a particular example, the same straight line S1 can extend through the first terminal 10a and the third terminal 10c, but that need not be the case. In one embodiment, the same straight line S2 can extend through the second terminal 10b and the fourth terminal 10d, but that need not be the case.

In one example, the bond pads 42 of the first microelectronic element 36 can be electrically connected to the conductive elements 9 by first leads 48 having portions aligned with the first opening 16. Likewise, the bond pads 59 of the second microelectronic element 53 can be electrically connected to the conductive elements 11 by second leads 65 having portions aligned with the second opening 26. In one embodiment, the first leads 48 may not extend through the first opening 16, for example, if the first leads are lead bonds. Likewise, the second leads 65 may not extend through the second opening 26, for example, if the second leads are lead bonds.

As shown in FIG. 3A, the bond pads 42 of the first microelectronic element 36 can be electrically connected to the conductive elements 9 by wire bonds 48 extending through the first opening 16. Likewise, the bond pads 59 of the second microelectronic element 53 can be electrically connected to the conductive elements 11 by wire bonds 65 extending through the second opening 26. In a particular example, the first wire bonds 48 may extend through only the first opening 16, and the second wire bonds may extend through only the second opening 26.

In an exemplary embodiment, the first and second microelectronic elements 36 and 53 can have respective bond pads 42 and 59 that are configured in a manner similar to that shown in FIGS. 1B and 1C. In such an example, the first and second microelectronic elements 36, 53 can each have at least one row of five or more of the respective bond pads 42, 59 extending in the first direction in a central region of the respective front surface 40, 57 thereof, each central region extending a middle third of a distance between opposed first and second edges of the respective microelectronic element.

Figure 3C:
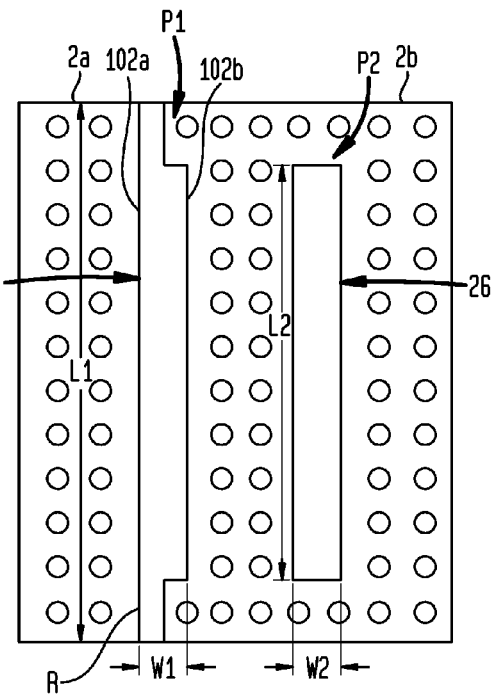
FIG. 3C is another potential bottom view of the embodiment of FIG. 3A, having two dielectric elements.

FIG. 3C shows another potential bottom view of the microelectronic assembly 100 of FIG. 3A. In the embodiment shown in FIG. 3C, the substrate 2 can include first and second spaced apart dielectric elements 2a, 2b disposed adjacent one another, each dielectric element having opposed top and bottom surfaces. The two dielectric elements 2a and 2b can be coplanar with one another, such that the first surface 4 of the substrate 2 can include the top surfaces of both dielectric elements, and the second surface 6 of the substrate can include the bottom surfaces of both dielectric elements.

In another example, any or each of the dielectric elements described herein, such as the dielectric elements 2a and 2b shown in FIG. 3C, can each be replaced by a substrate element consisting essentially of a semiconductor material such as silicon. In a particular embodiment, any or each of the dielectric elements described herein can each be replaced by a substrate element that can include a layer of semiconductor material and one or more dielectric layers. In yet another embodiment, any or each of the dielectric elements described herein can each be replaced by a lead frame having leads, wherein the terminals can be portions of the leads, such as end portions of the leads.

The first opening 16c can be defined by an open area between adjacent opposed edges 102a, 102b of the first and second dielectric elements 2a, 2b. The adjacent opposed edges 102a, 102b can each have a first dimension L1 and can each extend in the first direction D1. The first opening 16c can have a second dimension W1 in the second direction D2 shorter than the first dimension L1. The second opening 26 can be the same as in FIG. 3B, such that the second opening can be enclosed by the second dielectric element 2b.

Similar to the embodiment shown in FIG. 3B, at least one of the terminals 10, for example a first terminal 10a, can be disposed at least partially within a first peripheral region P1 such that a straight line S1 extending in the first direction D1 and passing through the first terminal 10a passes through or over the first opening 16c. At least one of the terminals 10, for example a second terminal 10b, can be disposed at least partially within the second peripheral region P2 such that a straight line S2 extending in the first direction D1 and passing through the second terminal passes through or over the second opening 26. Likewise, at least one third and fourth terminal 10c and 10d can be disposed at least partially within third and fourth peripheral regions as described above with respect to FIG. 3B.

In a particular example, the second opening 26 can be oriented perpendicularly to the first opening 16c. For example, the second opening 26 can have a first dimension L2 in the second direction D2 and a second dimension W2 in the first direction D1 shorter than the first dimension. In one embodiment, the substrate 2 can also include a dielectric region R extending between the adjacent opposed edges 102a, 102b of the first and second dielectric elements 2a, 2b, the first surface of the substrate including a top surface of the dielectric region, the second surface including a bottom surface of the dielectric region. In a particular example, the dielectric region R can have a higher Young's modulus in a plane of the substrate than the dielectric elements 2a, 2b.

As shown in FIGS. 3A and 3C, the first microelectronic element 36 can overlie the first opening 16c, and the second microelectronic element 53 can overlie the second opening 26, such that the microelectronic element that is closer to the substrate 2 is the one that overlies the first opening. However, that need not be the case. In another embodiment, the microelectronic element that is closer to the substrate 2 (e.g., the first microelectronic element 36) can overlie the second opening 26, and the microelectronic element that is farther away from the substrate (e.g., the second microelectronic element 53) can overlie the first opening 16c.

FIG. 3D shows another potential bottom view of the microelectronic assembly 100 of FIG. 3A. In the embodiment shown in FIG. 3D, the substrate 2 can include first, second, and third spaced apart dielectric elements 2a, 2b, and 2c disposed adjacent one another, each dielectric element having opposed top and bottom surfaces. The three dielectric elements 2a, 2b, and 2c can be coplanar with one another, such that the first surface 4 of the substrate 2 can include the top surfaces of all three dielectric elements, and the second surface 6 of the substrate can include the bottom surfaces of all three dielectric elements.

The first opening 16d, similar to the first opening 16c of FIG. 3C, can be defined by an open area between adjacent opposed edges of the first and second dielectric elements 2a, 2b. The second opening 26d can be defined by an open area between adjacent opposed edges of the second and third dielectric elements 2b, 2c.

Similar to the embodiment shown in FIG. 3C, at least one of the terminals 10, for example a first terminal 10a, can be disposed at least partially within a first peripheral region P1 such that a straight line S1 extending in the first direction D1 and passing through the first terminal 10a passes through or over the first opening 16d. At least one of the terminals 10, for example a second terminal 10b, can be disposed at least partially within the second peripheral region P2 such that a straight line S2 extending in the first direction D1 and passing through the second terminal passes through or over the second opening 26d. Likewise, at least one third and fourth terminal 10c and 10d can be disposed at least partially within third and fourth peripheral regions as described above with respect to FIG. 3B.

In one example, the terminals 10 can include first, second, and third terminals exposed at the bottom surface of the respective first, second, and third dielectric elements 2a, 2b, and 2c, and at least some of the bond pads 42, 59 of at least one of the microelectronic elements 36, 53 can be electrically connected with two or more of the first, second, and third terminals of the respective first, second, and third substrate portions. In a particular embodiment, at least some of the bond pads 42 of the first microelectronic element 36 can be electrically connected to the terminals 10 of the first and second substrate portions 2a, 2b. In one embodiment, at least some of the bond pads 59 of the second microelectronic element 53 can be electrically connected to the terminals 10 of the second and third substrate portions 2b, 2c.

FIGS. 3E, 3F, and 3G each show an alternative potential bottom view of the microelectronic assembly 100 of FIG. 3A. The embodiment shown in FIG. 3E is the same as the embodiment shown in FIG. 3D, except that each peripheral region can include a plurality of terminals 10 disposed adjacent one another in the first direction D1. For example, the peripheral region P1 includes terminals 10a and 10a', and a straight line S1 extending in the first direction between the first opening 16e and a peripheral edge of the substrate 2 extends through both of the terminals 10a and 10a'.

The embodiment shown in FIG. 3F is the same as the embodiment shown in FIG. 3D, except that the peripheral regions are located on the first and third substrate portions 2a and 2c, rather than on the second substrate portion 2b. The embodiment shown in FIG. 3G is the same as the embodiment shown in FIG. 3F, except that the second substrate portion 2b has a first width W in a central portion thereof that is greater than a second width W' in a peripheral portion thereof, the peripheral portions being adjacent the central portion along the first direction D1.

Figure 3H:
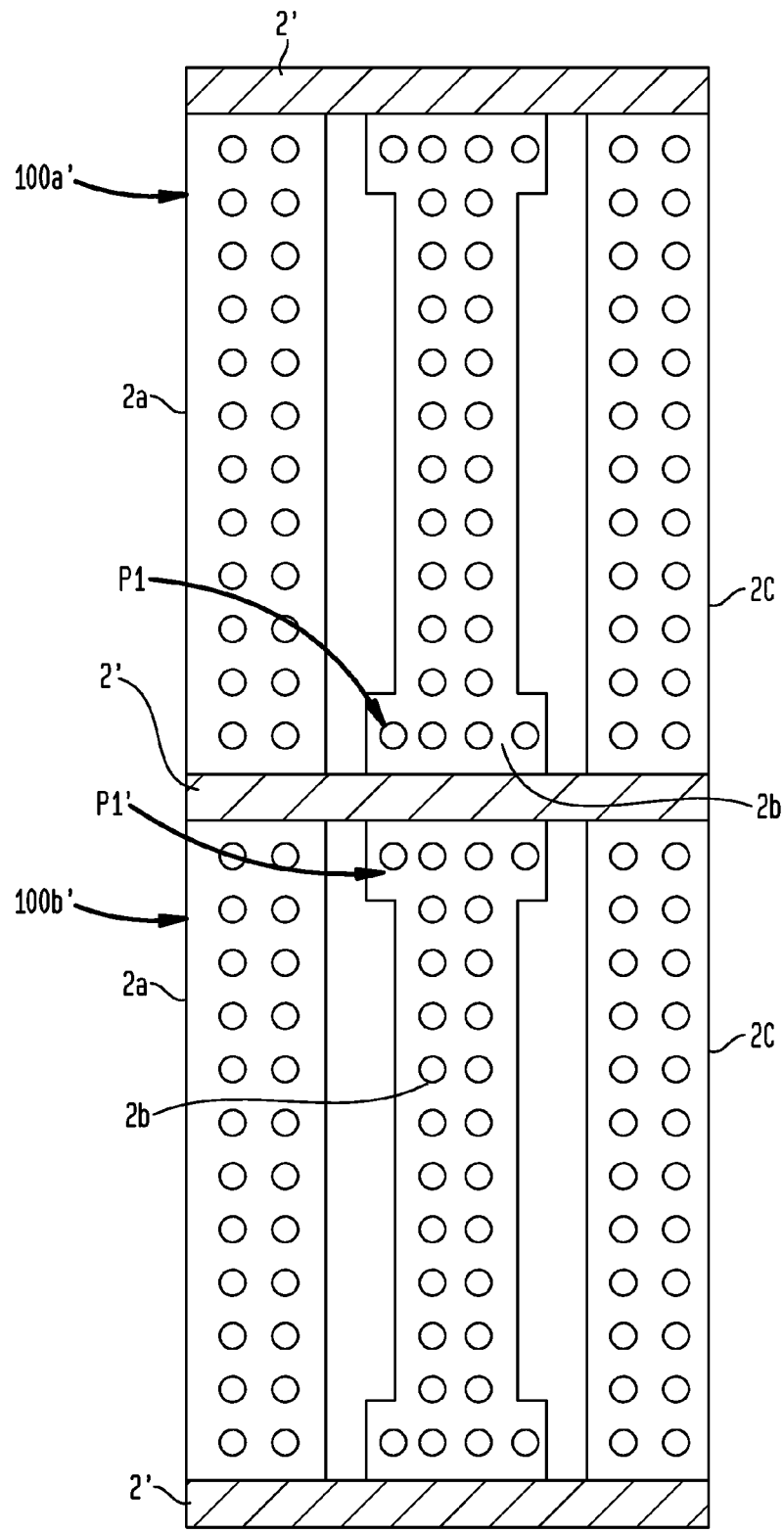
FIG. 3H is an in-process assembly of a plurality of microelectronic assemblies shown in FIG. 3D.

FIG. 3H shows an in-process assembly that includes a plurality of microelectronic assemblies 100' shown in FIG. 3D. FIG. 3H shows a first microelectronic assembly 100a' and a second microelectronic assembly 100b'. The first and second microelectronic assemblies 100 are joined by a connecting portion 2' of the substrate 2 that joins adjacent ones of the substrate portions 2a, 2b, and 2c. For example, the connection portion 2' of the substrate 2 joins the first substrate portions 2a of each of the first and second microelectronic assemblies, the second substrate portions 2b of each of the microelectronic assemblies, and the third substrate portions 2c of each of the microelectronic assemblies. After fabrication of each of the microelectronic assemblies 100', the connecting portions 2' can be removed from the microelectronic assemblies, for example, by dicing, thereby singulating the individual microelectronic assemblies.

Although in FIGS. 3A-3H, the first and second openings are shown as parallel to one another, in other embodiments, the first and second openings of any of the embodiments shown in FIGS. 3A-3H can be oriented transverse to one another, as shown in FIG. 1, for example. In such an embodiment, either the first opening or the second opening can enclosed by a dielectric element of the substrate, and the other opening can be defined by an open area between adjacent opposed edges of first and second dielectric elements. In a particular example, both the first and second openings can be defined by respective open areas between adjacent opposed edges of adjacent dielectric elements.

Although in FIGS. 3A-3H, the microelectronic assemblies are described as having two microelectronic elements, in other embodiments, any of the microelectronic assemblies shown in FIGS. 3A-3H can also include a third microelectronic element or third and fourth microelectronic elements. For example, the embodiments shown in FIGS. 6, 9, and 12 can include a substrate having two, three, four, five, or any other number of spaced apart dielectric elements disposed adjacent one another.

In a particular example, any of the configurations of microelectronic elements and openings shown in FIGS. 3A-3H can duplicated adjacent to one another in a single microelectronic assembly. For example, as shown in FIG. 3I, the microelectronic element configuration of FIG. 3A can be duplicated, such that a single substrate 2i can have four openings 16, 26, 32, and 82 and two partially overlapping pairs of microelectronic elements, such that a first overlapping pair of microelectronic elements 36 and 53 can overlie the first two openings 16 and 26, and a second overlapping pair of microelectronic elements 68 and 88 adjacent the first pair can overlie the second two openings 32 and 82.

Figure 3I:
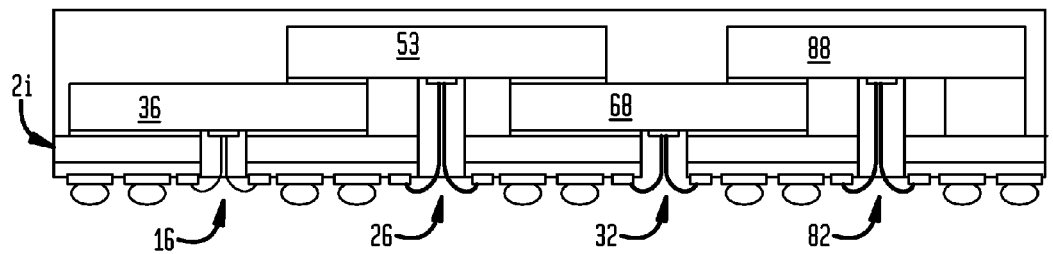
FIG. 3I is a cross-section of a variation of the embodiment of FIG. 3A.

In one example, the fourth microelectronic element 88 of FIG. 3I can be omitted, so that the microelectronic assembly may have three partially overlapping microelectronic elements, with two of the three microelectronic elements arranged with the front surfaces thereof in a single plane parallel to a surface of the substrate, and the other microelectronic element having a front surface arranged in a different plane parallel to a surface of the substrate.

Figure 3J:
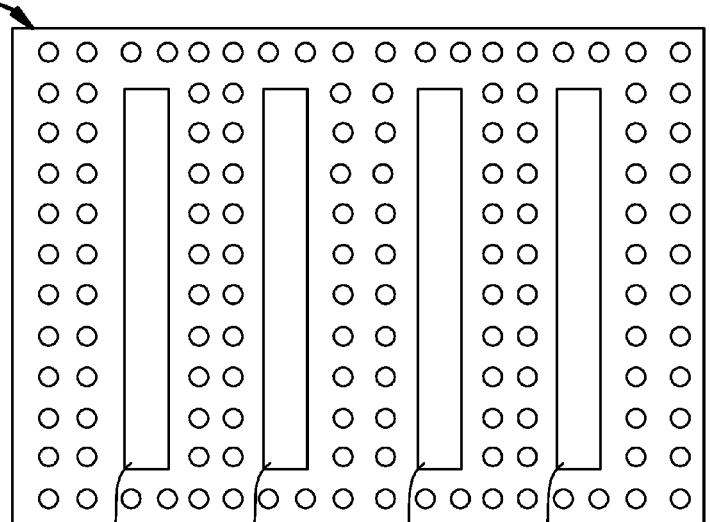
FIG. 3J is one potential bottom view of the embodiment of FIG. 3I.
Figure 3K:
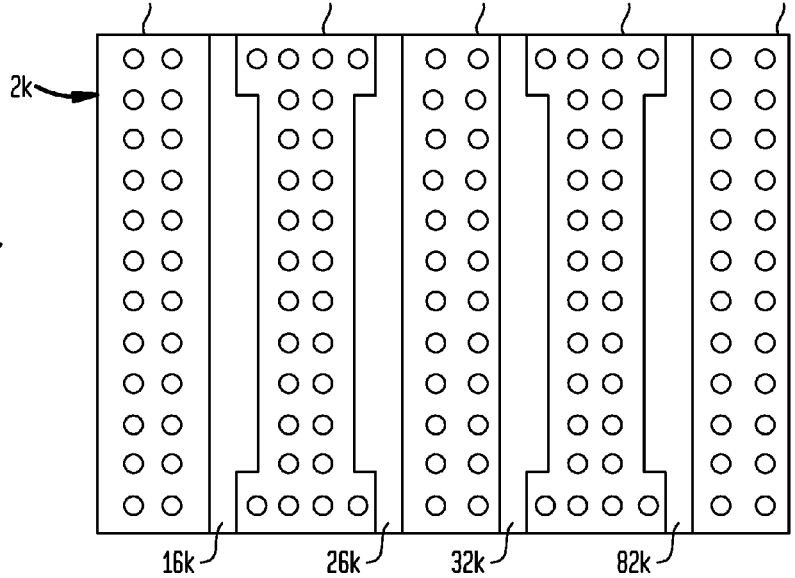
FIG. 3K is another potential bottom view of the embodiment of FIG. 3I, having a plurality of dielectric elements.

The embodiment of FIG. 3I can have various bottom view configurations. In one example, as shown in FIG. 3J, the configuration shown in FIG. 3B can be duplicated, such that a single substrate 2j can have four parallel openings 16j, 26j, 32j, and 82j each enclosed by the substrate, and contacts of a corresponding one of the microelectronic elements can be aligned with each opening 16j, 26j, 32j, and 82j. In another example, as shown in FIG. 3K, the configuration shown in FIG. 3D can be duplicated, such that a single substrate 2k can have five spaced apart dielectric elements 2a, 2b, 2c, 2d, and 2e disposed against one another, and contacts of a corresponding one of the microelectronic elements can be aligned with each opening 16k, 26k, 32k, and 82k, each such opening being defined by an open area between adjacent opposed edges of adjacent ones of the dielectric elements. In other embodiments, features of the substrates of FIGS. 3J and 3K can be combined into a single embodiment, such that one or more of the four microelectronic elements of FIG. 3I can each overlie an opening enclosed by a dielectric element of the substrate, and one or more of the four microelectronic elements of FIG. 3I can each overlie an opening defined by an open area between adjacent opposed edges of adjacent ones of the dielectric elements.

Figure 4:
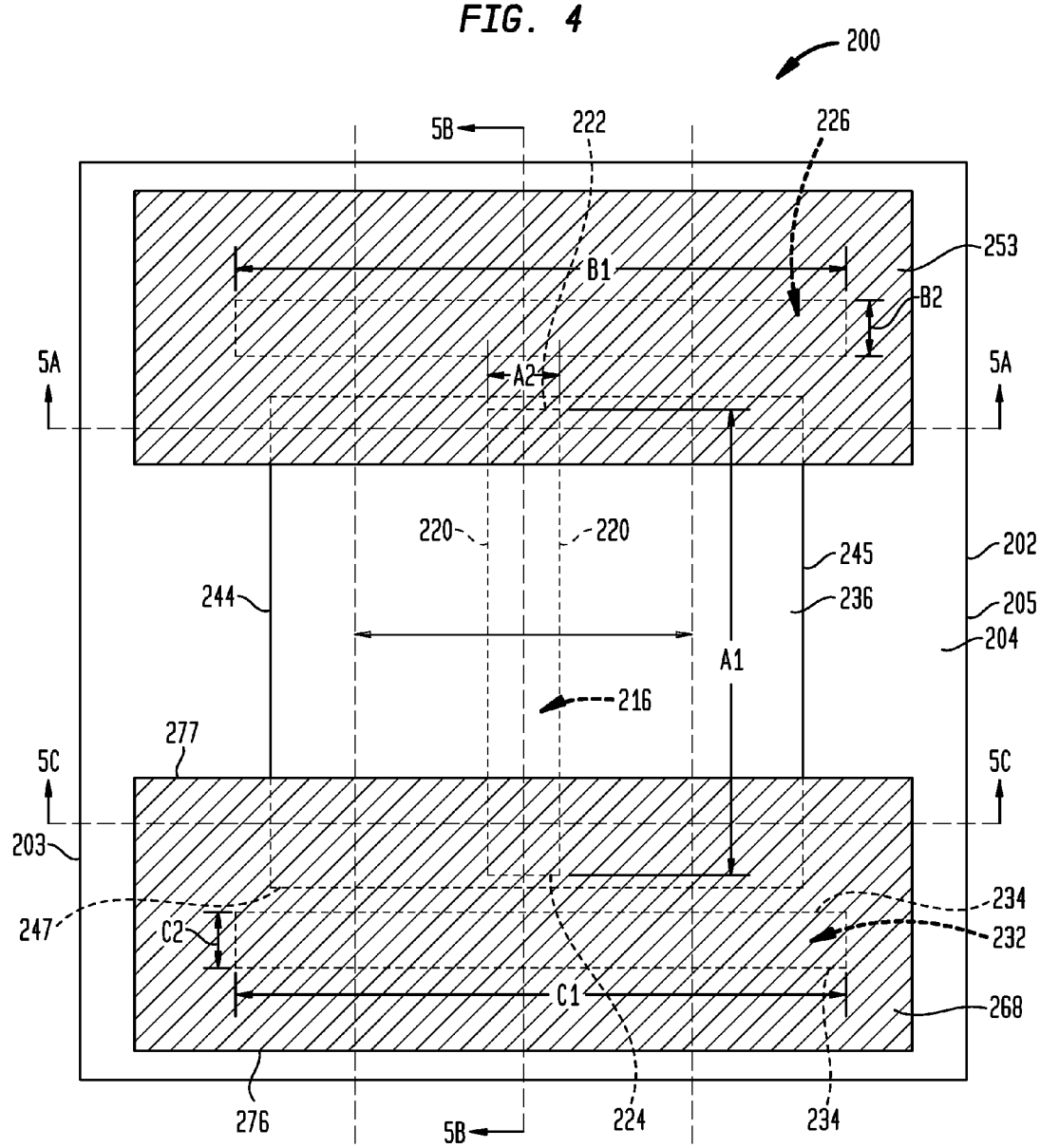
FIG. 4 is top plan view of an alternative embodiment of the present invention.
Figure 5A:
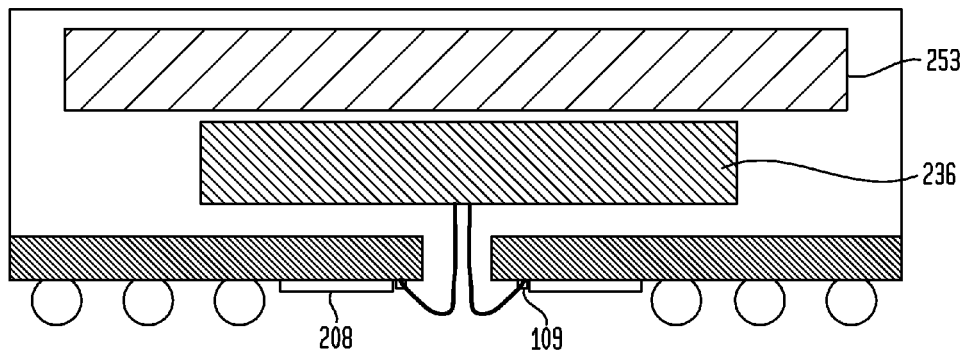
FIG. 5A is a cross-section of FIG. 4 taken through line 5A-5A.
Figure 5B:
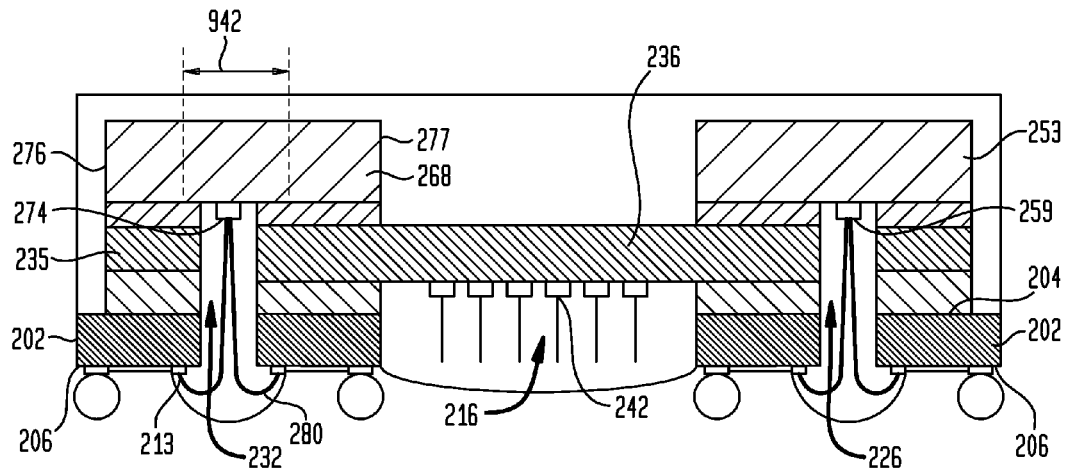
FIG. 5B is a cross-section of FIG. 4 taken through line 5B-5B.
Figure 5C:
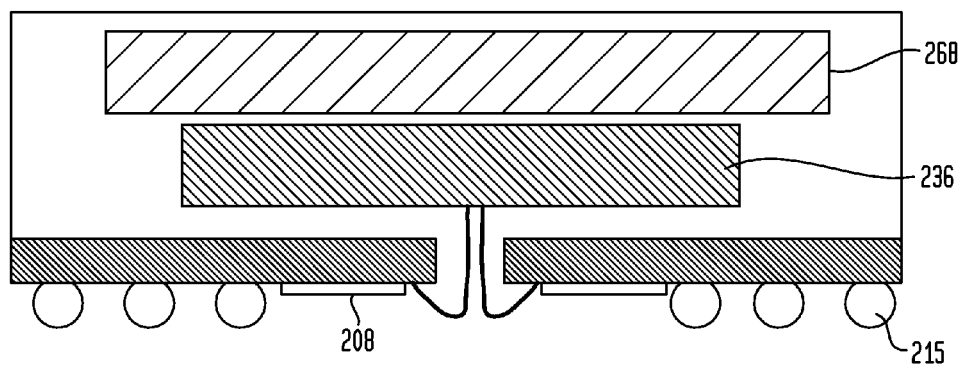
FIG. 5C is a cross-section of FIG. 4 taken through line 5C-5C.
Figure 6:
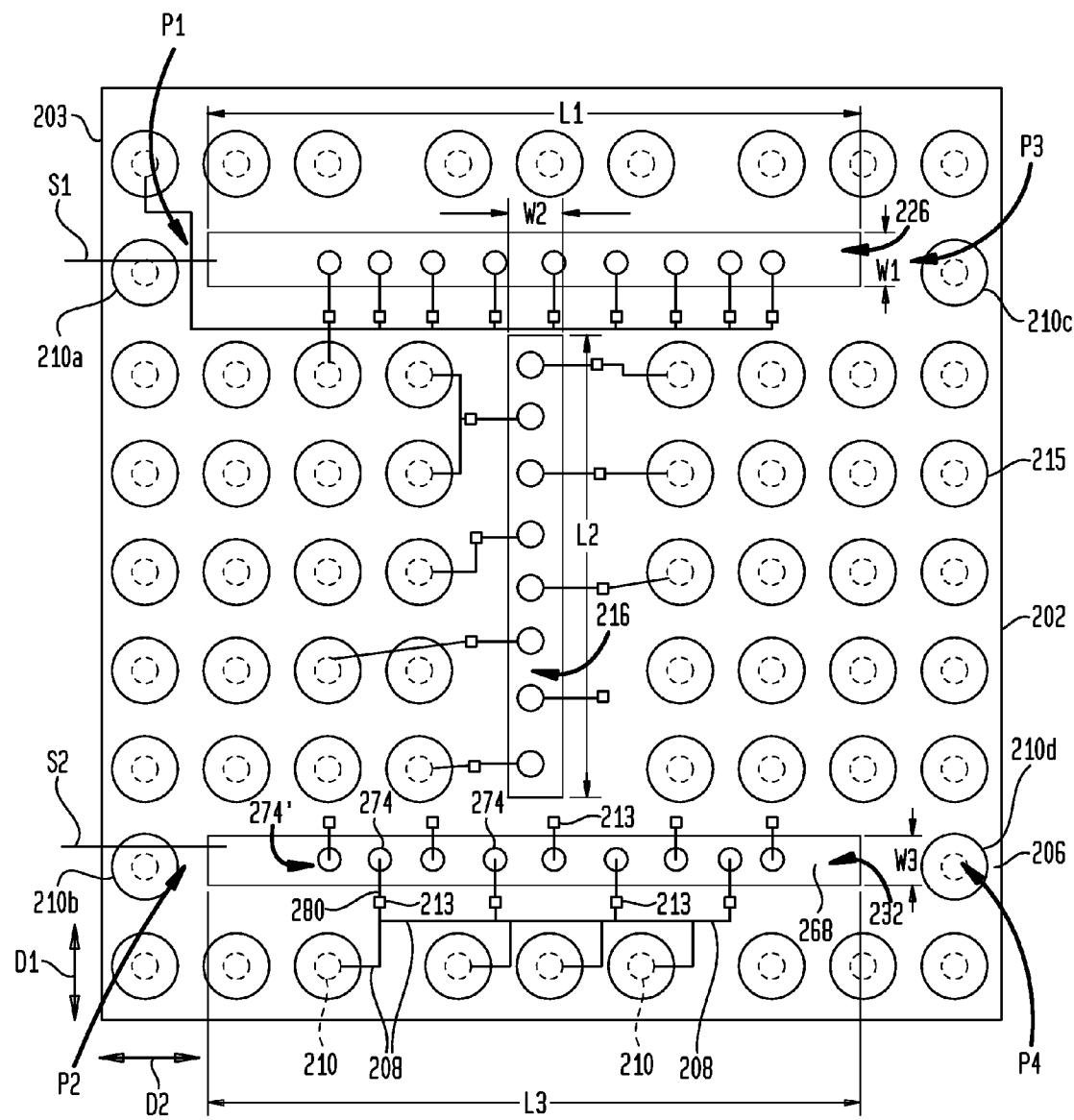
FIG. 6 is a bottom view of FIG. 4.

FIGS. 4-6 illustrate an alternative stacked microelectronic assembly 200 that includes three stacked microelectronic elements in a front face-down position. As best shown in FIGS. 5A and 5B, both a second microelectronic element 253 and third microelectronic element 268 may overlie the first microelectronic element 236.

As best shown in FIGS. 4 and 5B, the substrate 202 has a first surface 204 and second surface 206, as well as three openings extending between the first and second surfaces

204,206. As in the previous embodiment, the first opening 216 has a first end 222 and a second end 224 and may be positioned in the central portion of the substrate 202, which is also a middle one-third of the substrate 202 between the first edge 203 and opposed second edge 205 of the substrate. The first opening 216 includes short edges 218 at its first end 222 and second end 224. The second opening 226 may be positioned adjacent the first end 222 of the first opening 216.

A third opening 232 may be positioned adjacent the second end 224 of the first opening 216, so that the long edges 234 of the third opening 232 extend in a direction that is transverse to the direction in which the long edges 220 of the first opening 216 extend. In this configuration, the second and third openings 226,232 can be parallel to one another and also perpendicular to the first opening 216, so as to form the shape of an I. Alternatively, the first, second, and third openings 216,226,232 may be joined together such that they form one continuous opening. As in previous embodiments, one or more of the first, second, or third openings 216,226,232 may be comprised of a plurality of openings.

In one example, the first opening 216 can have a long dimension A1 greater than a short dimension A2, the long dimension A1 extending in a first direction D1, and the short dimension A2 extending in a second direction D2 transverse to the first direction. The second opening 226 can have a long dimension B1 greater than a short dimension B2, the long dimension B1 extending in the second direction D2, and the short dimension B2 extending in the first direction D1. The third opening 232 can have a long dimension C1 greater than a short dimension C2, the long dimension C1 extending in the second direction D2, and the short dimension C2 extending in the first direction D1.

The first and second microelectronic elements 236,253 are stacked in an arrangement similar to the embodiment of FIGS. 1-3 and differ to the extent that a third microelectronic element 268 is included in the assembly. Referring to FIGS. 5A and 5B, the first microelectronic element 236 and second microelectronic element 253 lie in different planes. As better shown in FIG. 5B, a third microelectronic element 268 may be positioned adjacent the first and second microelectronic elements 236,253. In this embodiment, the third microelectronic element 268 lies in the same plane as the second microelectronic element 253, but not in the same plane as the first microelectronic element 236. As shown, one or more spacers 235 can be used to support the third microelectronic element 268 above the first microelectronic element 236, such that the second edges 277 of the third microelectronic element 268 overlies or overlaps the fourth edge 247 of the first microelectronic element 236, and portions of the respective first and second edges 244,245 of the first microelectronic element 236. Bond pads 274 on the third microelectronic element 268 extend along a portion of the central region 942 of the third microelectronic element 268 (FIGS. 5B,6) and face the third opening 232. As in the previously disclosed embodiment, the central region 942 can be positioned on the middle third of the length between the first and second edges 276,277 of the third microelectronic element 268. Bond pads 274 on the third microelectronic element 268 may be aligned and exposed through the third opening 232.

As described above with respect to the embodiments having two microelectronic elements, the third microelectronic element 268 can have at least one row of five or more bond pads 274 extending in a direction in the central region of the front surface of the third microelectronic element. In a particular example, at least one row of five or more of the bond pads 274 of the third microelectronic element 268 can be disposed adjacent a peripheral edge of the third microelectronic element. As shown in FIG. 6, at least one row 274' of five or more bond pads 274 of the third microelectronic element 268 can extend in the same direction D2 in which the long dimension of the second opening 226 and the third opening 232 can extend, which can be transverse to the direction D1 in which the long dimension of the first opening 216 can extend, but that need not be the case.

Conductive connections may be used to connect each of the bond pads on the respective microelectronic elements with respective sets of contacts on the bottom surface of the substrate. For example, as shown, bond wires 280 connect bond pads 274 exposed at the surface of the third microelectronic element 268 with a third set of contacts 213 on the second surface 206 of the substrate 202. Referring to FIG. 6, conductive traces 208 may then electrically connect each of the bond pads 274 on the third microelectronic element 268 with the terminal contacts 210 which support the solder balls. The terminals 210 can be configured for connecting the microelectronic assembly 200 to at least one component external to the assembly.

As with respect to the previous embodiment, the arrangement of the first, second, and third microelectronic elements 236,253,268 allows for each of the respective bond pads 242,259,274 (FIG. 5B) of the respective first, second and third microelectronic elements 236,253,268 to be aligned with the respective first, second, and third openings 216, 226,232. This, in turn, allows for conductive connections to pass within or through the first, second and third openings 216,226,232 without interference from adjacent conductive connections. Additionally, this allows for the stacking of two or more chips having bond pads positioned on a central region of the chip.

In a particular example, the substrate 202 can also have a first peripheral edge 203 extending between the first and second surfaces 204, 206 and in the first direction D1. The substrate 202 can also have a second peripheral edge 205 extending between the first and second surface 204, 206 and in the first direction D1.

The first opening 216 can have an elongated first dimension L1 extending in the first direction D1 and a second dimension W1 in the second direction D2 shorter than the first dimension. The second opening 226 can have an elongated first dimension L2 extending in the second direction D2 and a second dimension W2 in the first direction D1 shorter than the first dimension. The third opening 232 can have an elongated first dimension L3 extending in the second direction D2 and a second dimension W3 in the first direction D1 shorter than the first dimension.

The substrate 202 can have first and second peripheral regions P1, P2 of the second surface 206 extending between the first peripheral edge 203 and the respective second and third openings 226, 232. The substrate 202 can also have third and fourth peripheral regions P3, P4 of the second surface 206 extending between the second peripheral edge 205 and the respective second and third openings 226, 232. The first and third peripheral regions P1, P3 can be located at opposite sides of the second opening 226, and the second and fourth peripheral regions P2, P4 can be located at opposite sides of the third opening 232.

As shown in FIG. 6, at least one of the terminals 210, for example a first terminal 210a, can be disposed at least partially within the first peripheral region P1 such that a straight line S1 extending in the second direction D2 and passing through the first terminal 210a passes through or over the second opening 226. At least one of the terminals 210, for example a second terminal 210b, can be disposed at least partially within the second peripheral region P2 such that a straight line S2 extending in the second direction D2 and passing through the second terminal passes through or over the third opening 232.

At least one of the terminals 210, for example a third terminal 210c, can be disposed at least partially within the third peripheral region P3 such that a straight line extending in the second direction D2 and passing through the third terminal 210c passes through or over the second opening 226. In a particular example, the same straight line S1 can extend through the first terminal 210a and the third terminal 210c, but that need not be the case.

At least one of the terminals 210, for example a fourth terminal 210d, can be disposed at least partially within the fourth peripheral region P4 such that a straight line extending in the second direction D2 and passing through the fourth terminal 210d passes through or over the third opening 232. In a particular example, the same straight line S2 can extend through the second terminal 210b and the fourth terminal 210d, but that need not be the case.

Figure 7:
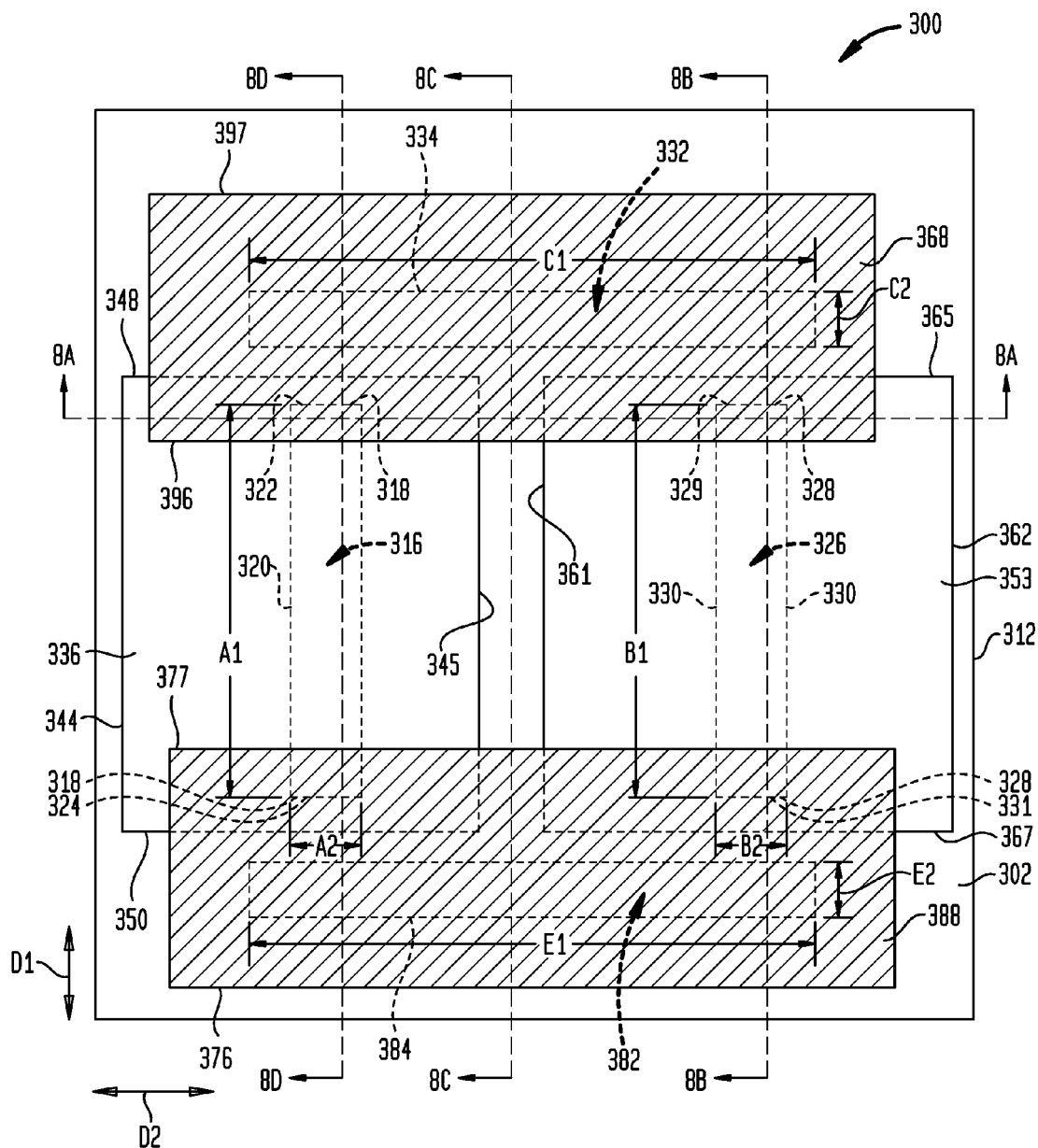
FIG. 7 is a plan view of an alternative embodiment of the present invention.
Figure 8A:
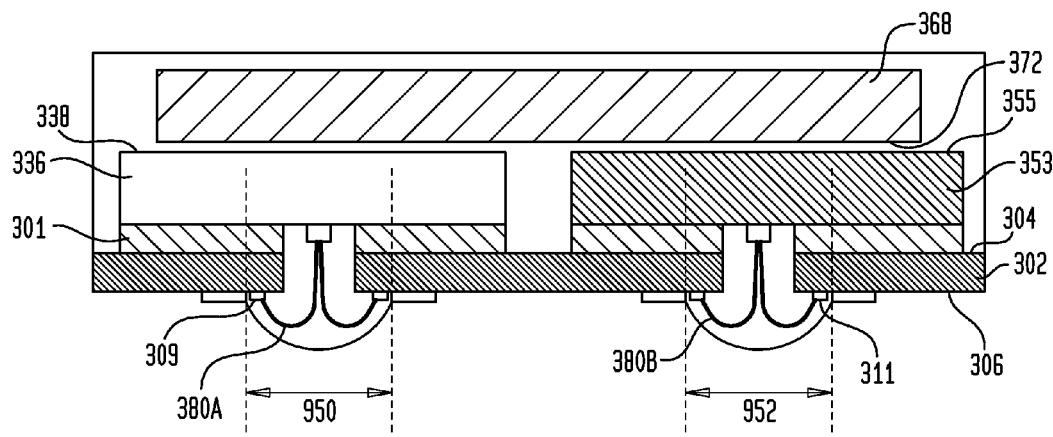
FIG. 8A is a cross-section of FIG. 7 taken through line 8A-8A.
Figure 8B:
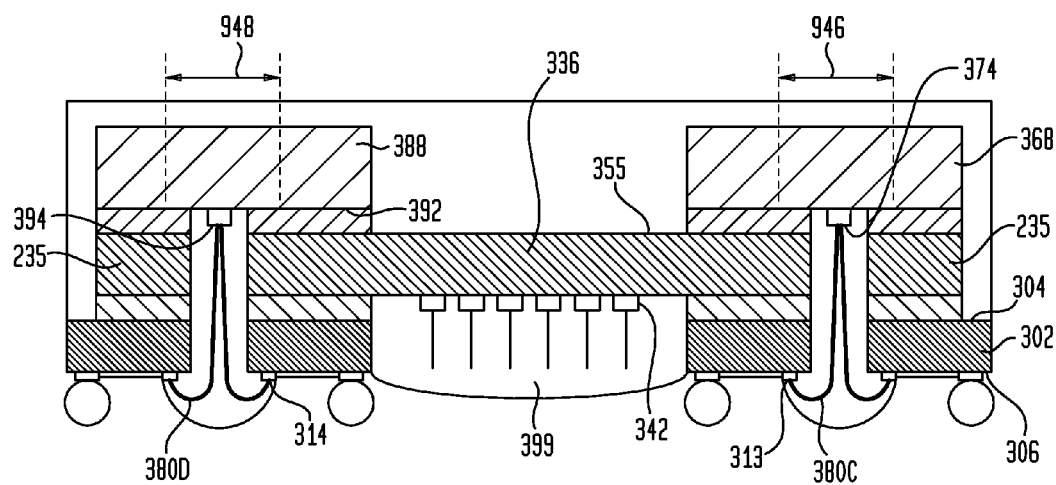
FIG. 8B is a cross-section of FIG. 7 taken through line 8B-8B.
Figure 8C:
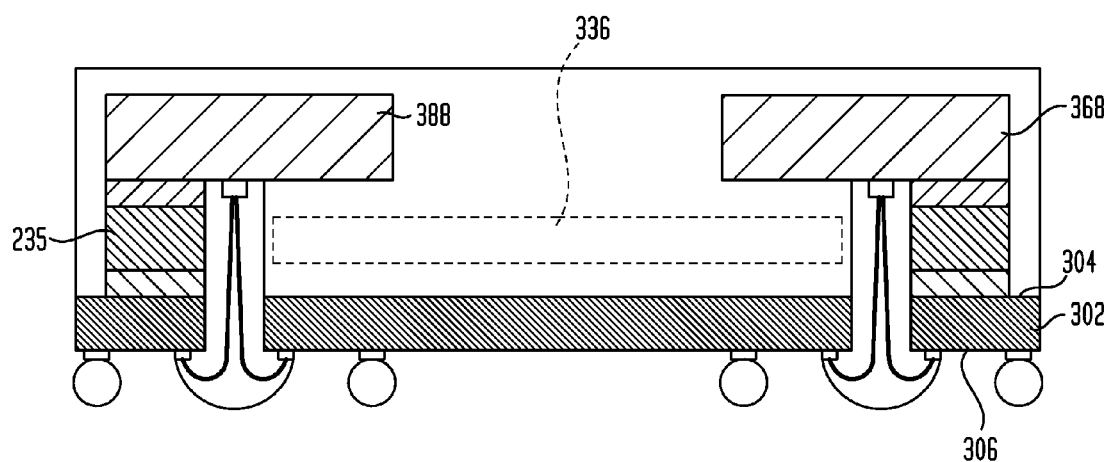
FIG. 8C is a cross-section of FIG. 7 taken through line 8C-8C.
Figure 8D:
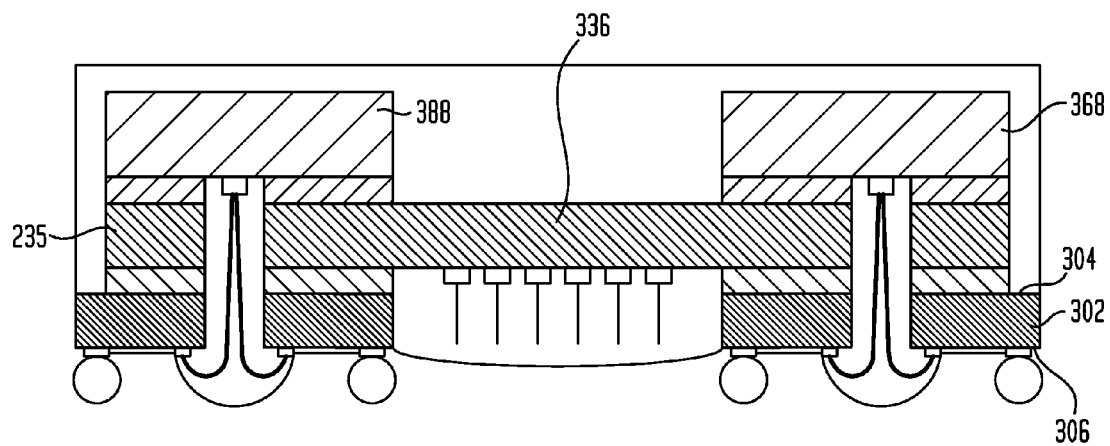
FIG. 8D is a cross-section of FIG. 7 taken at line 8D-8D.
Figure 9:
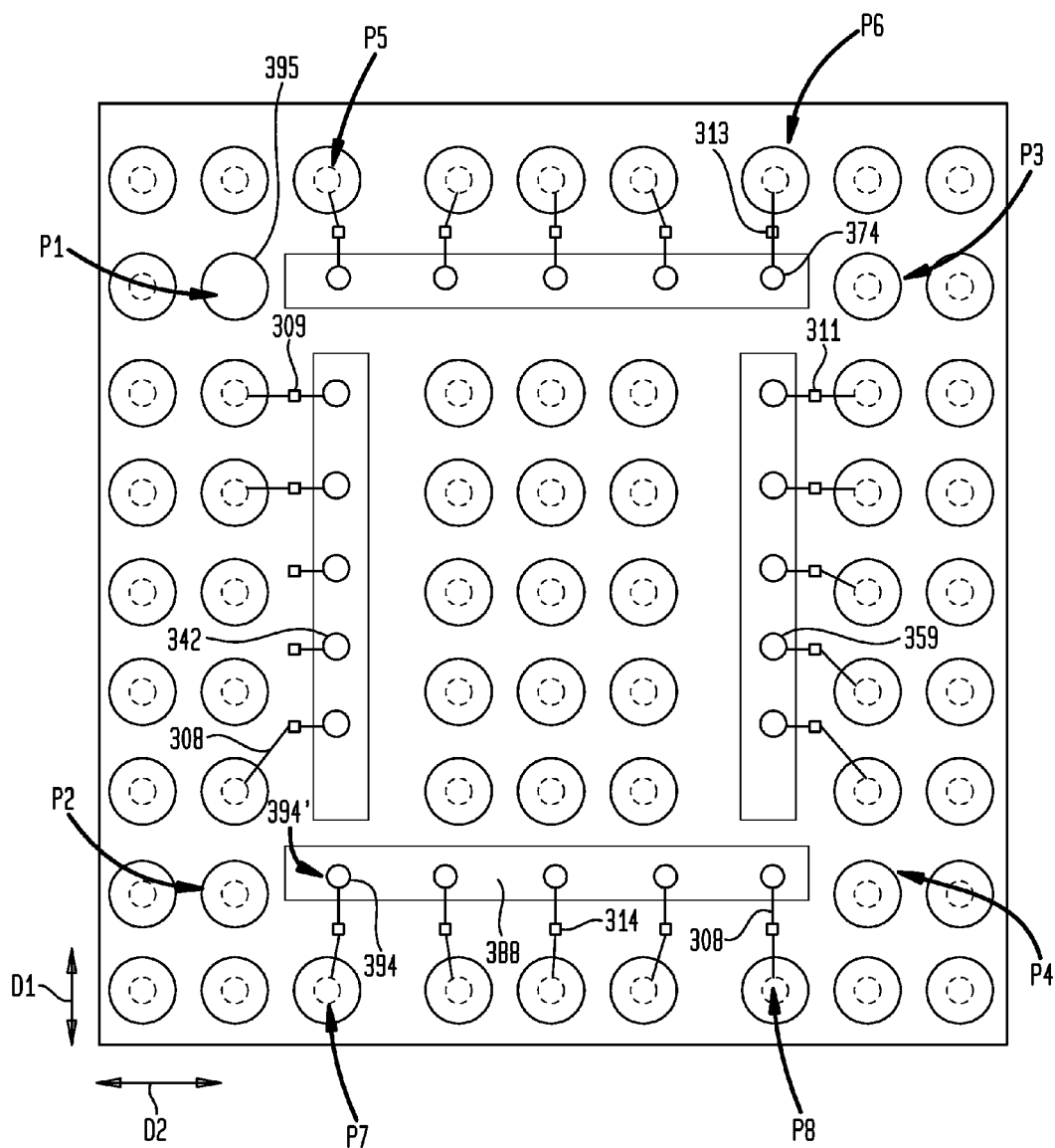
FIG. 9 is a bottom view of FIG. 7.

Referring now to FIGS. 7-9, another embodiment is shown illustrating a microelectronic assembly 300 that includes four stacked microelectronic elements overlying a substrate in a face-down position. In this embodiment, four openings extend through the first and second surfaces 304, 306 of the substrate 302. As best shown in FIG. 7, the first and second openings 316,326 are positioned in directions that are perpendicular to the third and fourth openings 332,382. The first opening 316 has long edges 320 and short edges 318, wherein the short edges 318 are located at a first end 322 and a second end 324 of the first opening 316. The second opening 326 also has a pair of short edges 328 and a pair of long edges 330, wherein the short edges 328 are located at a first end 329 and a second end 331 of the second opening 326, 326. The third opening 332 is located adjacent the respective first ends 322,329 of the first and second openings 316,326, whereas the fourth opening 382 is located adjacent the respective second ends 324,331 of the first and second openings 316,326. In this embodiment, the respective long edges 334,384 of the third and fourth openings 332,382 are not aligned with the long edges 320,330 of the respective first and second openings 316,326. As shown, the first and second openings 316, 326 are spaced further away from the outer peripheral edge 312 of the substrate 302 than the third and fourth openings 332, 382.

In one example, the first opening 316 can have a long dimension A1 greater than a short dimension A2, the long dimension A1 extending in a first direction D1, and the short dimension A2 extending in a second direction D2 transverse to the first direction. The second opening 326 can have a long dimension B1 greater than a short dimension B2, the long dimension B1 extending in the first direction D1, and the short dimension B2 extending in the second direction D2. The third opening 332 can have a long dimension C1 greater than a short dimension C2, the long dimension C1 extending in the second direction D2, and the short dimension C2 extending in the first direction D1. The fourth opening 382 can have a long dimension E1 greater than a short dimension E2, the long dimension E1 extending in the second direction D2, and the short dimension E2 extending in the first direction D1.

Referring to FIGS. 7-8C, the first and second microelectronic elements 336,353 may be attached to the substrate 302 using known materials, such as an adhesive 301 or the like, so that the front surface 340 of the first microelectronic element 336 and front surface 357 of the second microelectronic element 353 are positioned directly over the first surfaces 304 of the substrate 302. Bond pads 342 on the first microelectronic element 336 may also be positioned over the first opening 316 and bond pads 359 on the second microelectronic element 353 may be positioned over the second opening 326. As shown, the first and second edges 344,345 of the first microelectronic element 336 and the first and second edges 361,362 of the second microelectronic element 353 are parallel to one another, and extend in the same direction.

The third and fourth microelectronic elements 368,388 may be positioned over the substrate 302, as well as the first and second microelectronic elements 336,353. As best shown in FIGS. 7 and 8A, the front surface 372 of the third microelectronic element 368 overlies the rear surfaces 338, 355 of the first and second microelectronic elements 336, 353. Similarly, the front surface 392 of the fourth microelectronic element 388 overlies the rear surfaces 338,355 of the respective first and second microelectronic elements 336,353. Spacers 235 (FIGS. 8A,8B) may be used to support the portions of the third microelectronic element 368 and fourth microelectronic element 388 that face the first surface 304 of the substrate 302, but do not overlie the first and second microelectronic elements 336,353.

As shown in FIGS. 7 and 8B-8D, the third microelectronic element 368 is adjacent the respective first ends 348,365 of the first and second microelectronic elements 336,353. The fourth microelectronic element 388 is adjacent the second ends 350,367 of the respective first and second microelectronic elements 336,353. Additionally, the respective first and second edges 376,377 of the third microelectronic element 368 and first and second edges 396,397 of the fourth microelectronic element 388 extend in a direction that is perpendicular to both the respective first and second edges 344,345 of the first microelectronic element 336 and first and second edges 361,362 of the second microelectronic element 353. Consequently, referring to FIG. 9, the bond pads 374 extending along central region 946 (FIG. 8B) of the third microelectronic element 368 and the bond pads 394 extending along the central region 948 (FIG. 8B) of the fourth microelectronic element 388 will extend in a direction that is perpendicular to the respective bond pads 342,359 positioned near the respective central regions 950, 952 of the first and second microelectronic elements 336, 353. As described above with respect to the embodiments having two microelectronic elements, the fourth microelectronic element 388 can have at least one row 394' of five or more bond pads 394 extending in a direction in the central region of the front surface of the fourth microelectronic element.

The orientation of the respective microelectronic elements over the substrate 302 allows for an electrical connection between the bond pads 342 (FIG. 8D), 359 (FIG. 8B), 374, 394 of the first, second, third, and fourth microelectronic elements 336,353,368,388 to the respective first, second, third, and fourth sets of contacts 309,311,313,314 on the second surface 306 of the substrate 302. The electrical connection can be within or through the first, second, third, and fourth openings 316,326,332,382. In this embodiment, bond wires 380A, 380B (FIG. 8A), 380C, 380D (FIG. 8B) extending from the respective first, second, third, and fourth microelectronic elements 336,353,368,388 extend through the first, second, third, and fourth openings 316,326,332, 382, and connect to respective first, second, third, and fourth sets of contacts 309,311,313,314 on the substrate (FIGS. 8A,8B).

As shown in FIG. 9, traces 308 extending along the second surface 306 of the substrate 302 can connect the first, second, third, and fourth sets of contacts 309,311,313,314 to terminal contacts having conductive material, such as solder balls, dispersed thereon. The terminals can be configured for connecting the microelectronic assembly 300 to at least one component external to the assembly.

Similar to the embodiments shown and described with respect to FIGS. 3, 3A-3H, and 6, the substrate 302 can have peripheral regions extending between one or more of the openings 316, 326, 332, 382 and respective peripheral edges of the substrate. For example, the substrate can have peripheral regions P1 and P3 extending between opposite ends of the third opening 332 and opposite peripheral edges of the substrate 302, peripheral regions P2 and P4 extending between opposite ends of the fourth opening 382 and opposite peripheral edges of the substrate 302, peripheral regions P5 and P7 extending between opposite ends of the first opening 316 and opposite peripheral edges of the substrate 302, and peripheral regions P6 and P8 extending between opposite ends of the second opening 326 and opposite peripheral edges of the substrate 302. As shown in FIG. 9, at least one terminal exposed at the second surface 306 of the substrate 302 can be located in each of the peripheral regions P1-P8. In other embodiments, one or more of the peripheral regions P1-P8 may not have any terminals located therein.

In the embodiment shown in FIG. 9, or in any of the other embodiments disclosed herein, the substrate 302 can have apertures extending therethrough between the first and second surfaces 304, 306. In one embodiment, one or more such apertures can be located in one or more of the peripheral regions P1-P8 adjacent one or more of the terminals 310, or in place of one or more of the terminals, such as the aperture 395 located at least partially in the peripheral region P1. An underfill or encapsulant such as the encapsulant 399 shown in FIG. 8B can be injected through such apertures 395 to cover at least some of the bond pads 342 of the microelectronic element 336 and at least some of the contacts 309 with which the bond pads are electrically connected. Such apertures 395 can be located anywhere along the surfaces of the substrate 302, but in a preferred embodiment, one or more of the apertures are located in one or more of the peripheral regions P1-P8. In a particular example, the encapsulant 399 can be injected through the aperture 395 at an angle of approximately 45 to the front surfaces of one or more of the microelectronic elements 336, 353, 368, and 388.

Figure 9A:
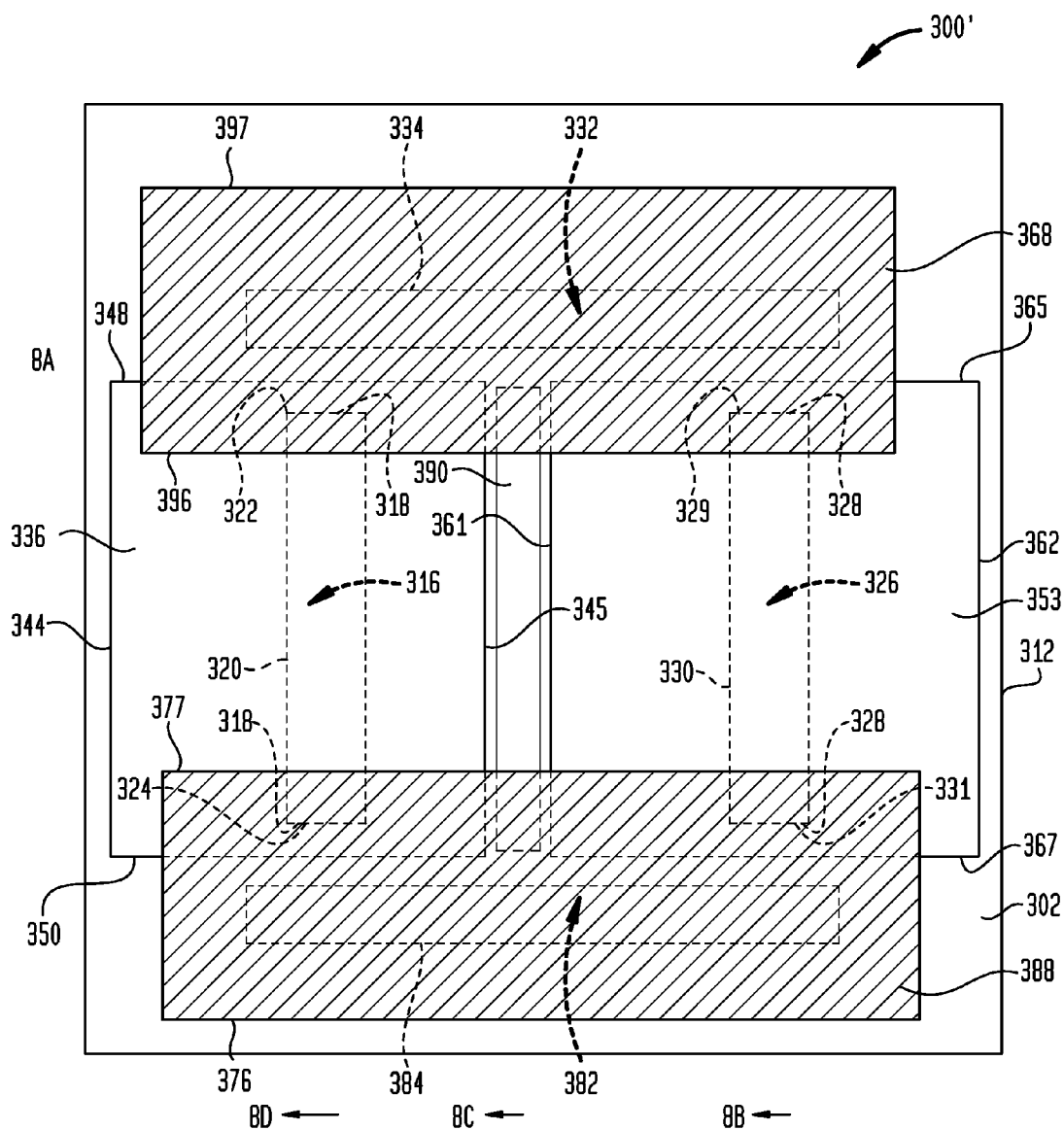
FIG. 9A is a plan view of an alternative embodiment of the present invention.
Figure 11A:
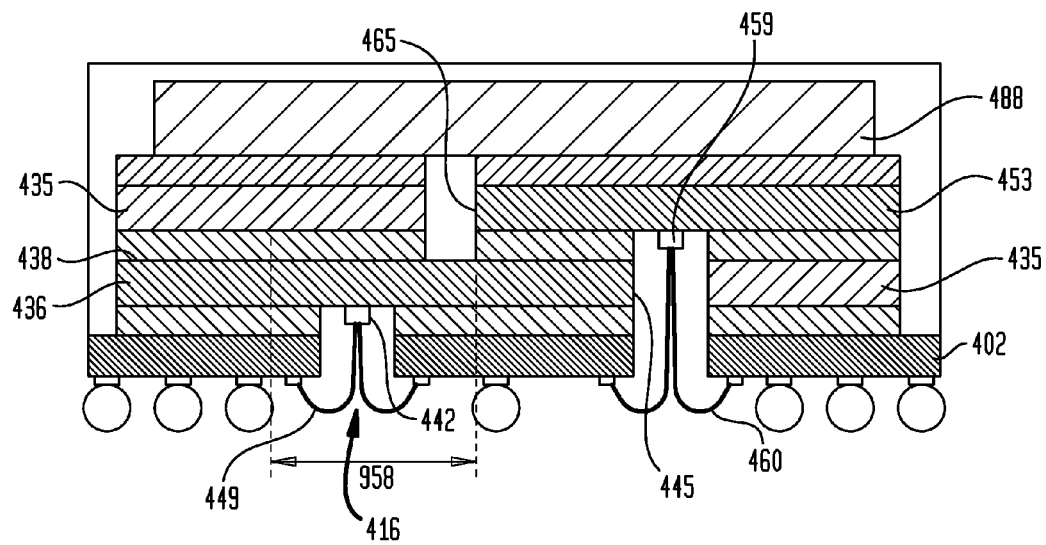
FIG. 11A is a cross-section of FIG. 10 taken through line 10A-10A.
Figure 11B:
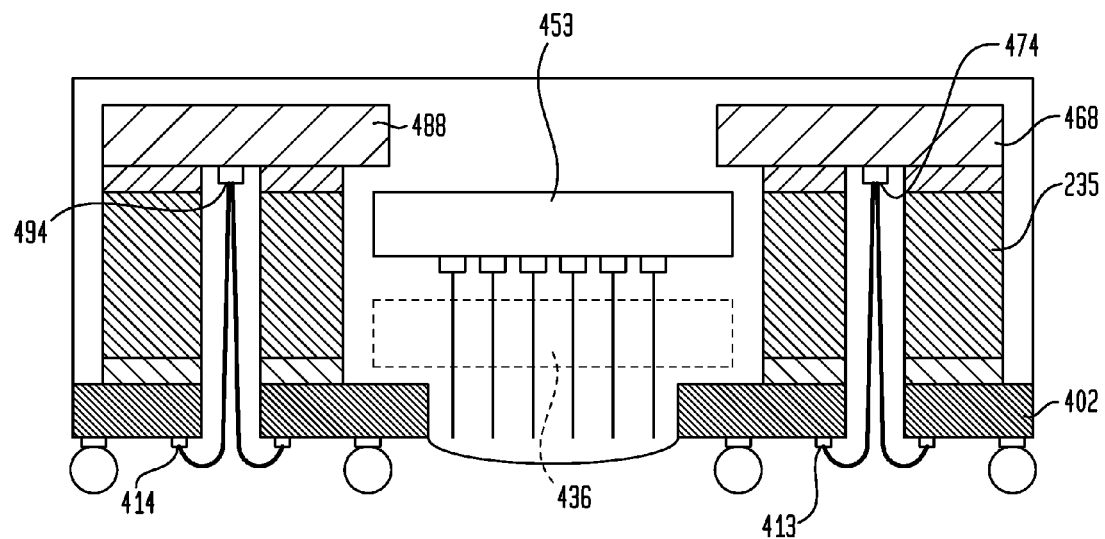
FIG. 11B is a cross-section of FIG. 10 taken through line 11B-11B.
Figure 11C:
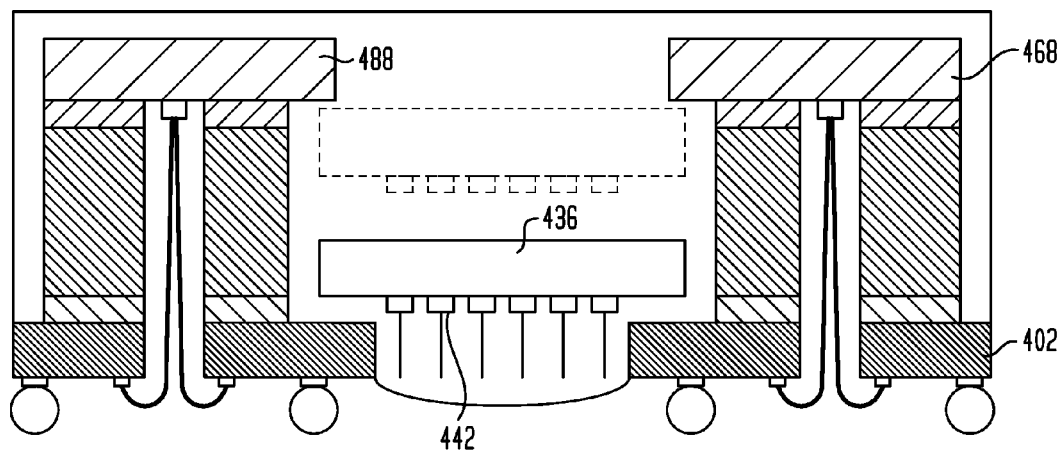
FIG. 11C is a cross-section of FIG. 10 taken through line 11C-11C.
Figure 11D:
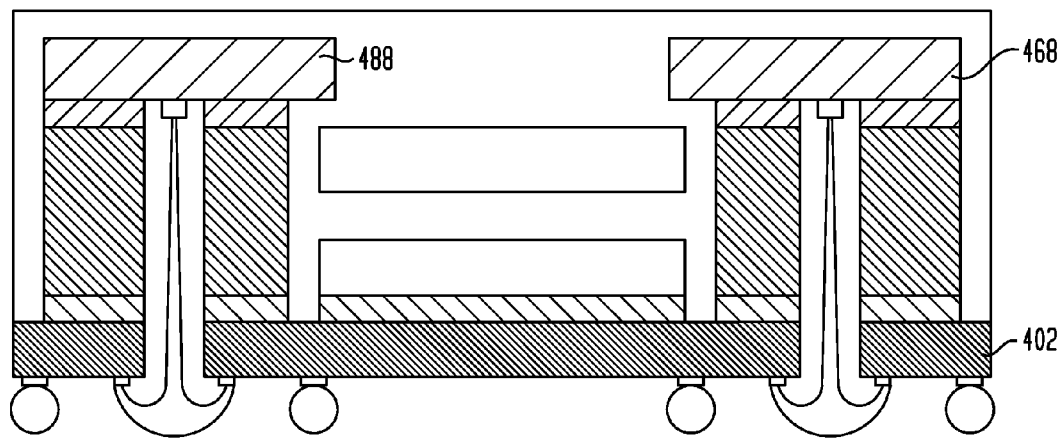
FIG. 11D is a cross-section of FIG. 10 taken through line 11D-11D.

As further shown in FIG. 9A, the microelectronic assembly 300' can further include a buffer element 390 disposed between spaced apart edges 345, 361 of the microelectronic elements whose contact-bearing surfaces 340, 357 are adjacent the substrate 302. In one embodiment, the buffer element 390 can regenerate at least one signal received at a terminal of the assembly from the buffer element to the first, second, third and fourth microelectronic elements 336, 353, 368, 388 on the assembly 300'. In this case, the buffer element 390 is configured to receive signals from the terminals and regenerate the signals and transfer the regenerated signals to one or more of the microelectronic elements on the assembly 300'. One benefit of such configuration is providing isolation between the microelectronic elements in the assembly 300' and a circuit panel connected thereto, such that interconnect stubs on the assembly are electrically isolated from the corresponding signal lines on the circuit panel. In such way, signal reflections caused by improperly terminated stubs within the assembly can be avoided.

Figure 12:
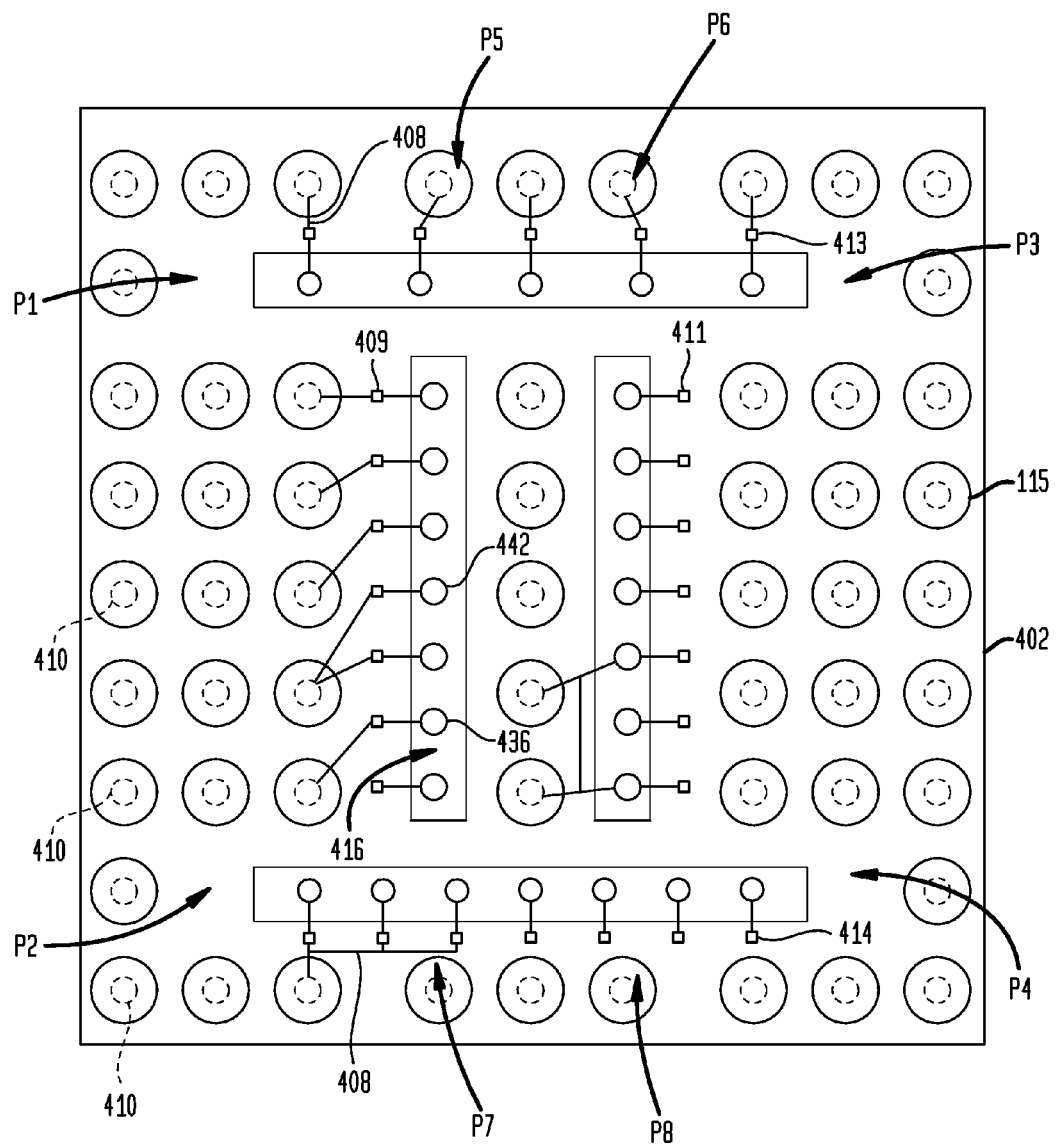
FIG. 12 is a bottom view of FIG. 10.

Referring now to FIGS. 10-12, an alternative embodiment of a stacked assembly 400 that includes center bonded microelectronic elements in a face-down position is shown. Referring first to FIGS. 10 and 11A, this embodiment differs to the extent that although the first and second microelectronic elements 436, 453 are adjacent one another, they do not lie in the same plane. As in the previous embodiments, the first microelectronic element 436 is in a face-down position so that bond pads 442 extending along a central region 958 (FIG. 11A) or middle third between first edge and second edge of the first microelectronic element 436 are exposed through the first opening 416 (FIGS. 11A and 12) of the substrate 402. The second microelectronic element 453 is positioned to overlie at least a portion of the first microelectronic element 436. As best seen in FIG. 11A, the first edge 465 of the second microelectronic element 453 overlies a portion of the second edge 445 of the rear surface 438 of the first microelectronic element 436. The third and fourth microelectronic elements 468, 488 are then positioned to overlie both the first and second microelectronic elements 436, 453, as discussed in previous embodiments. FIGS. 11B-11D further illustrate different views of the assembly that appear similar to those of FIGS. 7-9.

As in the previous embodiments, bond wires can be used to connect bond pads on the respective microelectronic elements with contacts on the substrate. Bond wires 449 on the first microelectronic element 436 extend from the bond pads 442 on the first microelectronic element 436, through a first opening 416 in the substrate 402 and to a first set of contacts 409 on the substrate 402. Bond wires 460 on the second microelectronic element 453 extend from bond pads 459 through a second opening 426 and connect to a second set of contacts 411 on the substrate 402. Bond wires 475 on the third microelectronic element 468 extend from the bond pads 474 through the third opening 432 and connect to a third set of contacts 413 on the substrate 402. As shown in FIG. 12, traces 408 can be used to connect each of the sets of contacts 409, 411, 413, 414 to terminal contacts 410 on the substrate 402. The terminals 410 can be configured for connecting the microelectronic assembly 400 to at least one component external to the assembly.

Similar to the embodiments shown and described with respect to FIGS. 4, 4A-3H, 6, and 9 the substrate 402 can have peripheral regions extending between one or more of the openings 416, 426, 432, 482 and respective peripheral edges of the substrate. For example, the substrate can have peripheral regions P1 and P3 extending between opposite ends of the third opening 432 and opposite peripheral edges of the substrate 402, peripheral regions P2 and P4 extending between opposite ends of the fourth opening 482 and opposite peripheral edges of the substrate 402, peripheral regions P5 and P7 extending between opposite ends of the first opening 416 and opposite peripheral edges of the substrate 402, and peripheral regions P6 and P8 extending between opposite ends of the second opening 426 and opposite peripheral edges of the substrate 402. As shown in FIG. 9, at least one terminal exposed at the second surface 406 of the substrate 402 can be located in each of the peripheral regions P1-P8. In other embodiments, one or more of the peripheral regions P1-P8 may not have any terminals located therein.

Figure 13:
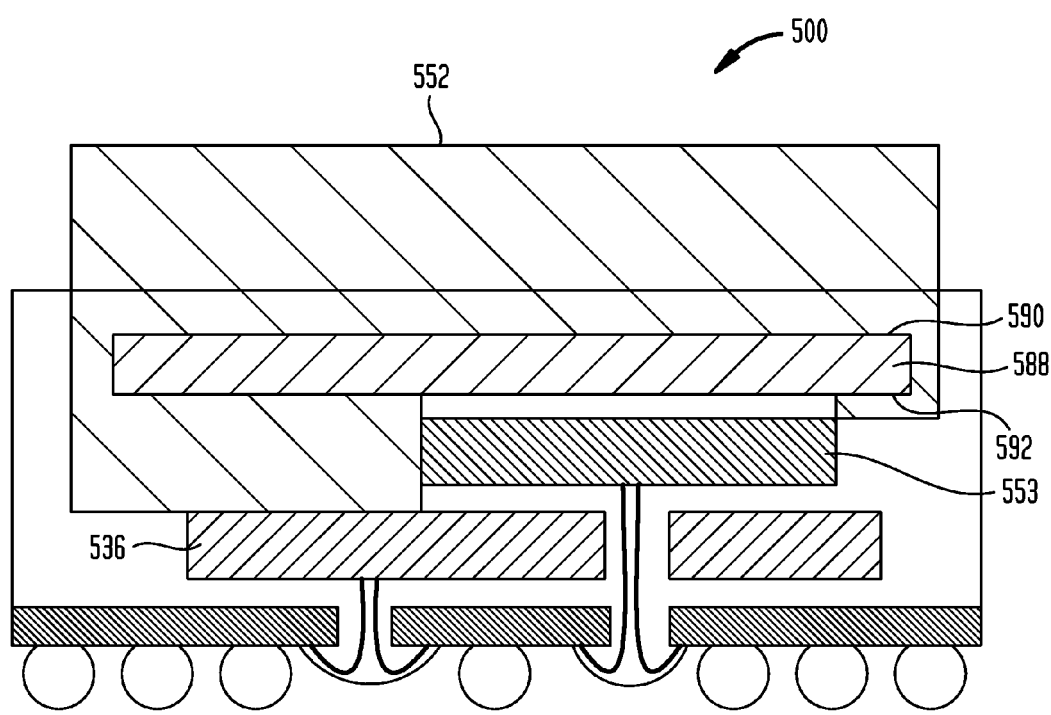
FIG. 13 is a plan view of an alternative embodiment of the present invention.

Turning to FIG. 13, in an alternative embodiment of FIGS. 10-12, a microelectronic assembly 500 further includes a heat spreader 552 in thermal communication with the rear surface 590 and a portion of the front surface 592 of the fourth microelectronic element 588. The heat spreader 552 may also extend between the first and second microelectronic elements 536, 553 to help distribute heat evenly within the arrangement of stacked microelectronic elements. The heat spreader 552 may also improve heat dissipation to the surrounding environment. The heat spreader 552 may be partly or entirely made of any suitable thermally conductive material. Examples of suitable thermally conductive material include, but are not limited to, metal, graphite, thermally-conductive adhesives, e.g., thermally-conductive epoxy, a solder, or the like, or a combination of such materials. In one example, the heat spreader 552 can be a substantially continuous sheet of metal. In a particular embodiment, a pre-formed heat spreader 552 made of metal or other thermally conductive material may be attached to or disposed on the rear surface 590 of the fourth microelectronic element 588 such as with a thermally conductive material such as a thermally conductive adhesive or a thermally conductive grease. The adhesive, if present, can be a compliant material which permits relative movement between the heat spreader and the microelectronic element to which it is attached, such as to accommodate differential thermal expansion between the compliantly attached elements. The heat spreader 552 may also contact third microelectronic element 568 (not shown), a first surface of the first microelectronic element 536, and a portion of the second microelectronic element 553. The heat spreader 552 may be a monolithic structure. Alternatively, the heat spreader 552 may include multiple spreader portions spaced apart from one another. In a particular embodiment, the heat spreader 552 may be or include a layer of solder joined directly to at least a portion of a rear surface of one or more of the first, second, third, and fourth microelectronic elements 536,553, 568,588.

It is to be appreciated that although the prior embodiments disclosed stacked microelectronic assemblies incorporating center-bonded chips, it is possible to also incorporate into any of the foregoing microelectronic assemblies at least one chip that is not center bonded. For example, referring to FIG. 14, a stacked microelectronic assembly is shown that is substantially similar to the embodiment FIGS. 4-6. This embodiment differs to the extent that modifications are necessary to accommodate the location of the bond pads along the edge of the second microelectronic element.

Figure 14:
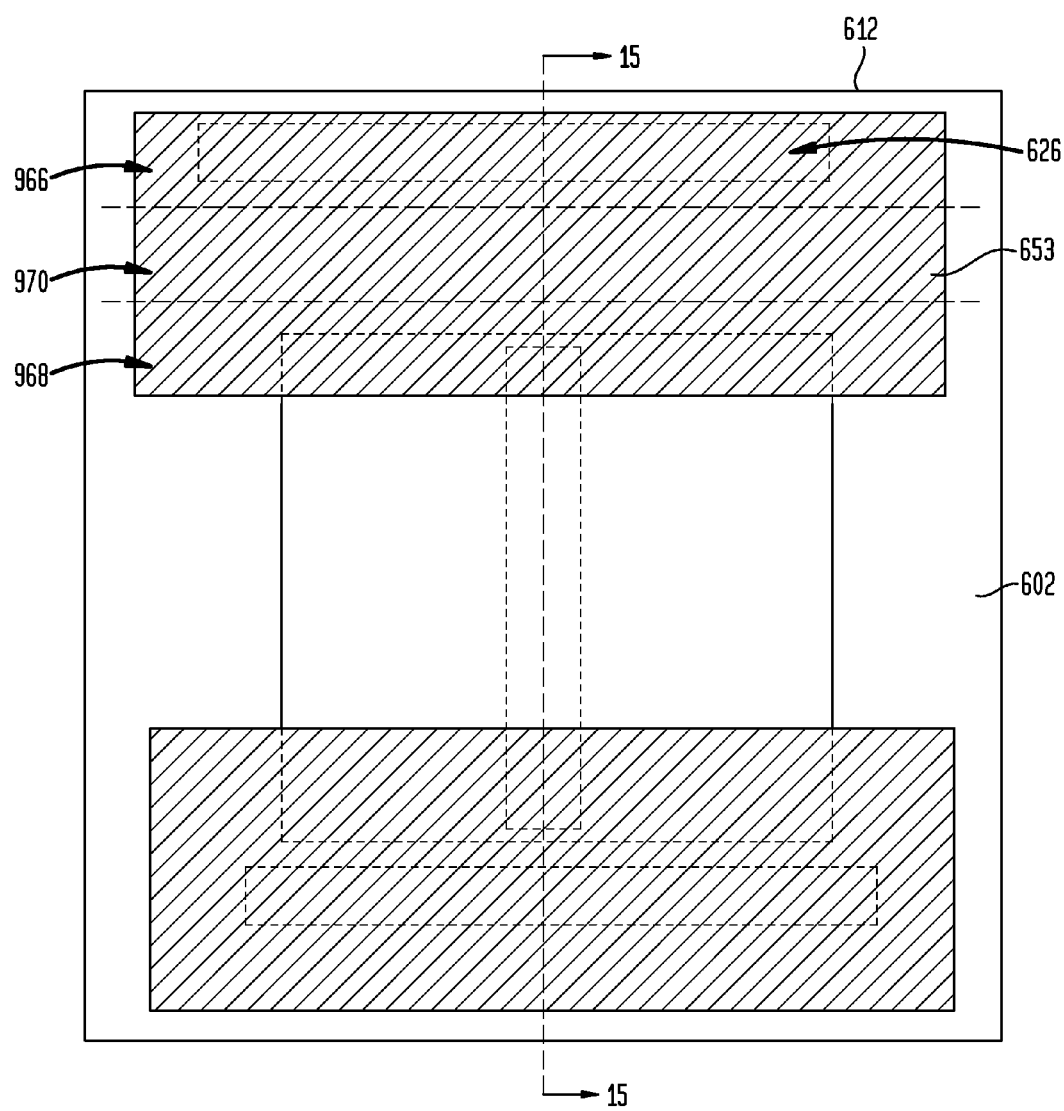
FIG. 14 is a top plan view of an alternative embodiment of the present invention.
Figure 15:
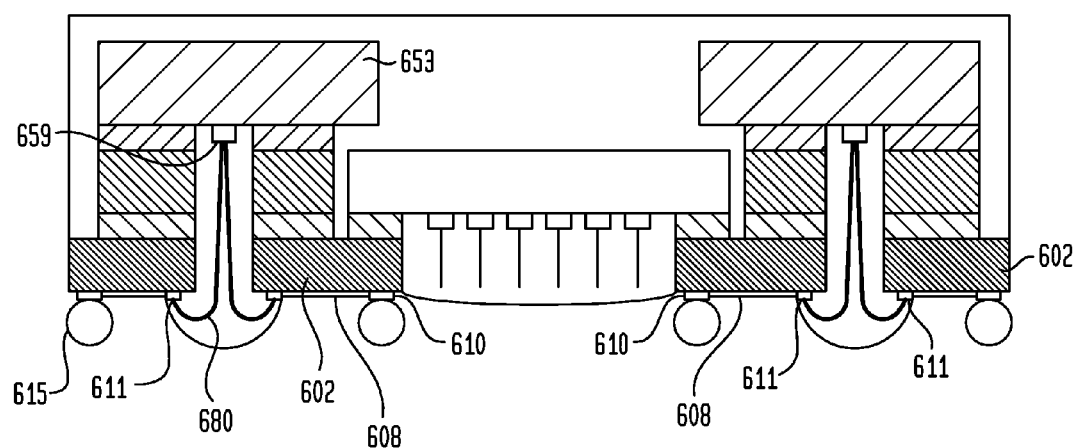
FIG. 15 is cross-sectional view of FIG. 14 taken along line 15-15.

As shown in FIG. 14, as in the previous embodiments, the second microelectronic element may include three regions, a first outer region 966, a second outer region 968, and a central region 970 positioned between the first outer region 966 and the second outer region 968. Bond pads 659 (FIG. 15) on the second microelectronic element 653 are positioned on the first outer region 966 of the front surface 657 of the second microelectronic element 653. To accommodate the location of the bond pads 659 on the first outer region 966 of the second microelectronic element 653, the second opening 626 of the substrate 602 is also positioned in the first outer region 966, directly adjacent the edge 612 (FIG. 14) of the substrate 602. Referring to FIG. 15, conductive connections are then capable of extending from the bond pads 659 on the second microelectronic element 653 to a second set of contacts 611 on the second surface 606 of the substrate 602. Traces 608 electrically connect the second set of contacts 611 to terminal contacts 610, which support solder balls 615.

It is to be appreciated that although in the previously disclosed embodiments, bond wires extending through an opening in the substrate were used to establish an electrical connection between the microelectronic element and contacts on the second surface of the substrate, any known structures or methods for establishing such a connection may be used. For example, in one embodiment, referring to FIGS. 16-17B, first and second microelectronic elements 736,753 are stacked in a manner similar to the embodiment shown in FIGS. 1-3. In this alternative embodiment, two additional types of bonding are illustrated. Such bonding techniques are disclosed, for example, in U.S. Pat. No. 5,861,666, the disclosure of which is incorporated herein by reference.

Figure 17A:
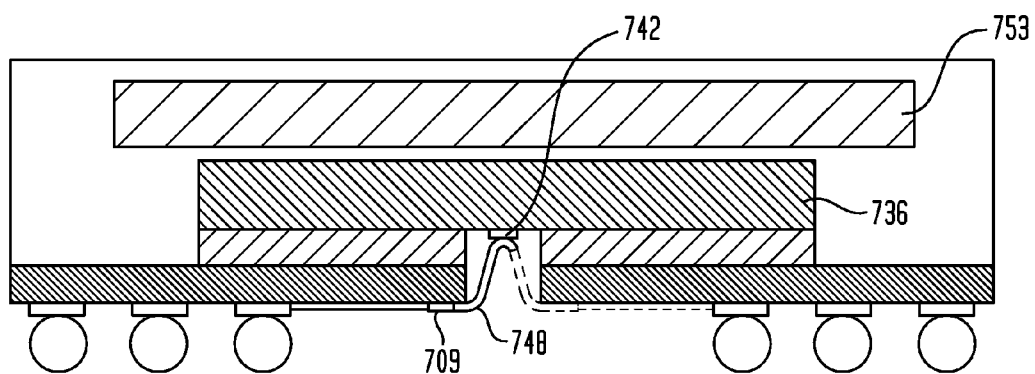
FIG. 17A is cross-sectional view of FIG. 16 taken along line 17A-17A.
Figure 17B:
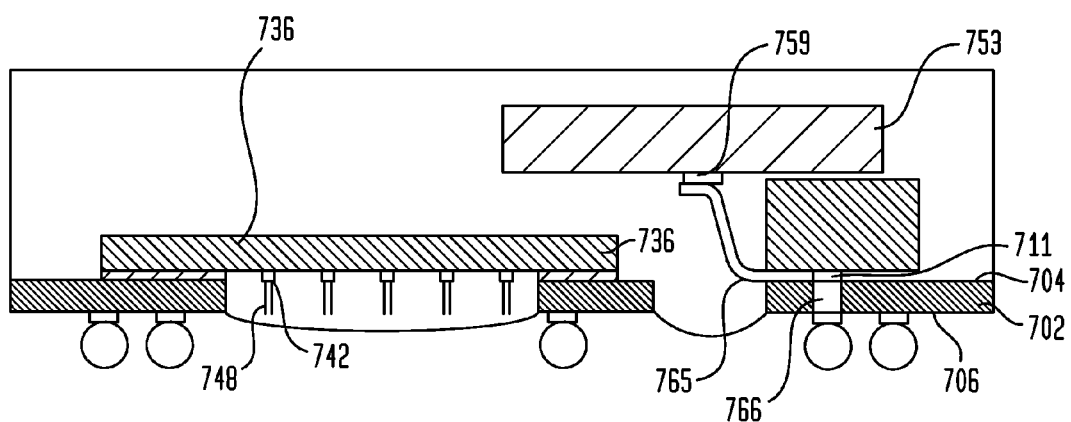
FIG. 17B is cross-sectional view of FIG. 16 taken along line 17B-17B.

Referring first to FIG. 17A, a lead bond 748 is shown extending from the bond pad 742 on the first microelectronic element 736 to the first set of contacts 709 on the second surface 706 of the substrate 702. The lead bond 748 is substantially more rigid than the bond wires disclosed in the previous embodiments. Turning now to FIG. 17B, a similar lead bond 765 may extend from the bond pad on the second microelectronic element 753 to the second set of contacts 711 on the first surface 704 of the substrate 702, as opposed to the second surface 706 of the substrate 702. A via 766 may extend between the first surface 704 and second surface 706 of the substrate 702. The via 766 may be filled with conductive material to conductively connect the contact on the first surface of the substrate with the terminal contact 710 on the second surface 706 of the substrate 702.

Figure 18:
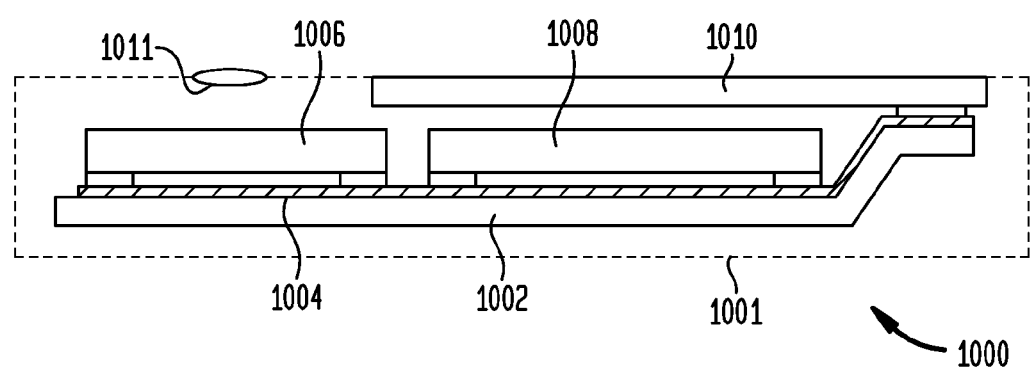
FIG. 18 is a schematic depiction of a system according to one embodiment of the invention.

The various microelectronic assemblies discussed above can be utilized in construction of diverse electronic systems. For example, referring to FIG. 18, a system 1000 in accordance with a further embodiment of the invention includes a structure 1006 as described in the prior embodiments of microelectronic assemblies above in conjunction with other electronic components 1008 and 1010. In the example depicted, component 1008 is a semiconductor chip whereas component 1010 is a display screen, but any other components can be used. Of course, although only two additional components are depicted in FIG. 18 for clarity of illustration, the system may include any number of such components. The structure 1006 as described above may be, for example, a composite chip or a structure incorporating plural chips. In a further variant, both may be provided, and any number of such structures may be used. Structure 1006 and components 1008 and 1010 are mounted in a common housing 1001, schematically depicted in broken lines, and are electrically interconnected with one another as necessary to form the desired circuit. In the exemplary system shown, the system includes a circuit panel 1002 such as a flexible printed circuit board, and the circuit panel includes numerous conductors 1004, of which only one is depicted in FIG. 18, interconnecting the components with one another. However, this is merely exemplary; any suitable structure for making electrical connections can be used. The housing 1001 is depicted as a portable housing of the type usable, for example, in a cellular telephone or personal digital assistant, and screen 1010 is exposed at the surface of the housing. Where structure 1006 includes a light-sensitive element such as an imaging chip, a lens 1011 or other optical device also may be provided for routing light to the structure. Again, the simplified system shown in FIG. 18 is merely exemplary; other systems, including systems commonly regarded as fixed structures, such as desktop computers, routers and the like can be made using the structures discussed above.

It will be appreciated that the various dependent claims and the features set forth therein can be combined in different ways than presented in the initial claims. It will also be appreciated that the features described in connection with individual embodiments may be shared with others of the described embodiments in various combinations.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic assembly, comprising:
a substrate having first and second opposed surfaces each extending in first and second transverse directions, the substrate having first and second dielectric elements spaced apart from one another in at least one of the first or second transverse directions;
an opening defined by an open area between adjacent opposed edges of the first and second dielectric elements, the adjacent opposed edges each having a first dimension extending in the first direction, the opening having a second dimension in the second direction shorter than the first dimension;
a microelectronic element having a front surface, a rear surface opposite from the front surface, and bond pads at the front surface, one of the front or rear surfaces facing toward the first surface; and
a plurality of terminals exposed at the second surface and electrically connected with the bond pads of the microelectronic element, the terminals configured for connecting the microelectronic assembly to at least one component external to the assembly.

2. The microelectronic assembly of claim 1, wherein the substrate further includes a dielectric region extending between the adjacent opposed edges of the first and second dielectric elements, the first surface of the substrate including a top surface of the dielectric region, the second surface including a bottom surface of the dielectric region.

3. The microelectronic assembly of claim 1, wherein the dielectric region has a higher Young's modulus in a plane of the substrate than the dielectric elements.

4. The microelectronic assembly of claim 1, wherein the front surface of the microelectronic element faces toward the first surface, and the bond pads at the front surface of the microelectronic element are aligned with the opening.

5. The microelectronic assembly of claim 1, wherein the terminals include first and second terminals exposed at the bottom surface of the respective first and second dielectric elements, and wherein at least some of the bond pads of the microelectronic element are electrically connected to the first and second terminals.

6. The microelectronic assembly of claim 1, wherein the microelectronic element at least partially overlies the top surface of each of the first and second dielectric elements.

7. The microelectronic assembly of claim 1, wherein the microelectronic has first and second opposed edges, and the microelectronic element has at least one row of five or more of the bond pads extending in the first direction in a central region of the front surface thereof, each central region extending a middle third of a distance between the respective first and second edges.

8. The microelectronic assembly of claim 1, wherein the substrate has a peripheral edge extending between the first and second surfaces and in the second direction and a peripheral region of the second surface extending between the peripheral edge and the opening, and
wherein at least one of the terminals is disposed at least partially within the peripheral region such that a straight line extending in the first direction and passing through the at least one terminal passes through or over the opening.

9. The microelectronic assembly of claim 8, wherein the peripheral edge is a first peripheral edge, the peripheral region is a first peripheral region, and the at least one of the terminals is a first terminal,
wherein the substrate has a second peripheral edge opposite the first peripheral edge extending between the first and second surfaces and in the second direction, and the substrate has a second peripheral region of the second surface extending between the second peripheral edge and the opening, and
wherein at least one of the terminals is a second terminal disposed at least partially within the second peripheral region such that a straight line extending in the first direction and passing through the second terminal passes through or over the opening.

10. The microelectronic assembly of claim 9, wherein the first dielectric element includes portions of both the first and second peripheral regions.

11. The microelectronic assembly of claim 10, wherein the second dielectric element includes portions of both the first and second peripheral regions.

12. The microelectronic assembly of claim 1, wherein the bond pads of the microelectronic element are electrically connected to the terminals by leads having portions aligned with the opening.

13. The microelectronic assembly of claim 12, wherein the leads include wire bonds extending through the opening.

14. A system comprising a microelectronic assembly according to claim 1 and one or more other electronic components electrically connected to the microelectronic assembly.

15. The system of claim 14, further comprising a housing, the microelectronic assembly and the other electronic components being mounted to the housing.

* * * * *